(12) United States Patent
Vaudrey et al.

(10) Patent No.: US 7,415,120 B1
(45) Date of Patent: Aug. 19, 2008

(54) USER ADJUSTABLE VOLUME CONTROL THAT ACCOMMODATES HEARING

(75) Inventors: Michael A. Vaudrey, Blacksburg, VA (US); William R. Saunders, Blacksburg, VA (US); Ronald D. Blum, Roanoke, VA (US)

(73) Assignee: Akiba Electronics Institute LLC, Wilmington, DE (US)

( * ) Notice: Subject to any disclaimer, the term of this patent is extended or adjusted under 35 U.S.C. 154(b) by 0 days.

(21) Appl. No.: 09/673,275

(22) PCT Filed: Apr. 14, 1999

(86) PCT No.: PCT/US99/08055
§ 371 (c)(1),
(2), (4) Date: Oct. 13, 2000

(87) PCT Pub. No.: WO99/53612

PCT Pub. Date: Oct. 21, 1999

Related U.S. Application Data

(63) Continuation-in-part of application No. 09/059,307, filed on Apr. 14, 1998, now abandoned, and a continuation-in-part of application No. 09/059,303, filed on Apr. 14, 1998, now abandoned, and a continuation-in-part of application No. 09/059,304, filed on Apr. 14, 1998, now abandoned.

(60) Provisional application No. 60/109,506, filed on Nov. 23, 1998.

(51) Int. Cl.
*H03G 3/00* (2006.01)

(52) U.S. Cl. ..................... 381/109; 381/119

(58) Field of Classification Search ............ 381/77, 381/82, 85, 120, 110, 104, 107, 56, 109, 381/119
See application file for complete search history.

(56) References Cited

U.S. PATENT DOCUMENTS

| | | |
|---|---|---|
| 2,783,677 A | 3/1957 | Becker |
| 3,046,337 A | 7/1962 | Hornyak |
| 3,110,769 A | 11/1963 | Bertram |
| 4,024,344 A | 5/1977 | Dolby et al. |
| 4,051,331 A | 9/1977 | Strong et al. |
| 4,052,559 A | 10/1977 | Paul et al. |
| 4,074,084 A | 2/1978 | van den Berg |
| 4,150,253 A | 4/1979 | Knoppel |
| 4,405,831 A | 9/1983 | Michelson |
| 4,406,001 A | 9/1983 | Klasco et al. |
| 4,454,609 A | 6/1984 | Kates |
| 4,484,345 A | 11/1984 | Stearns |
| 4,506,113 A | 3/1985 | Blomley |
| 4,516,257 A | 5/1985 | Torick |
| 4,622,440 A | 11/1986 | Slavin |
| 4,776,016 A | 10/1988 | Hansen |
| 4,809,337 A | 2/1989 | Scholz et al. |
| 4,816,905 A | 3/1989 | Tweedy et al. |
| 4,868,881 A | 9/1989 | Zwicker et al. |
| 4,890,170 A | 12/1989 | Inohana et al. |
| 4,941,179 A | 7/1990 | Bergenstoff et al. |
| 5,003,605 A | 3/1991 | Phillipps et al. |
| 5,033,036 A | 7/1991 | Ohmori et al. |
| 5,131,311 A | 7/1992 | Murakami et al. |
| 5,138,498 A | 8/1992 | Takigami |
| 5,144,454 A | 9/1992 | Cury |
| 5,146,504 A | 9/1992 | Pinckley |
| 5,155,510 A | 10/1992 | Beard |
| 5,155,770 A | 10/1992 | Maejima |
| 5,197,100 A | 3/1993 | Shiraki |
| 5,210,366 A | 5/1993 | Sykes, Jr. |
| 5,212,764 A | 5/1993 | Ariyoshi |
| 5,216,718 A | 6/1993 | Fukuda |
| 5,228,088 A | 7/1993 | Kane et al. |
| 5,294,746 A | 3/1994 | Tsumura et al. |
| 5,297,209 A | 3/1994 | Kowaki |
| 5,319,713 A | 6/1994 | Waller, Jr. et al. |
| 5,323,467 A | 6/1994 | Hermes |
| 5,341,253 A | 8/1994 | Liao et al. |
| 5,384,599 A | 1/1995 | Casavant et al. |
| 5,395,123 A | 3/1995 | Kondo |
| 5,396,560 A | 3/1995 | Arcos et al. |
| 5,400,409 A | 3/1995 | Linhard |

| | | | |
|---|---|---|---|
| 5,408,686 A | 4/1995 | Mankovitz | |
| 5,434,922 A | 7/1995 | Miller et al. | |
| 5,450,146 A | 9/1995 | Chedeville et al. | |
| 5,466,883 A | 11/1995 | Miyashita et al. | |
| 5,469,370 A | 11/1995 | Ostrover et al. | |
| 5,485,522 A | 1/1996 | Solve et al. | |
| 5,530,760 A | 6/1996 | Paisley | |
| 5,541,999 A | 7/1996 | Hirai | |
| 5,564,001 A | 10/1996 | Lewis | |
| 5,569,038 A | 10/1996 | Tubman et al. | |
| 5,569,869 A | 10/1996 | Sone | |
| 5,572,591 A | 11/1996 | Numazu et al. | |
| 5,576,843 A | 11/1996 | Cookson et al. | |
| 5,619,383 A | 4/1997 | Ngai | |
| 5,621,182 A | 4/1997 | Matsumoto | |
| 5,621,850 A | 4/1997 | Kane et al. | |
| 5,631,712 A | 5/1997 | Suh et al. | |
| 5,644,677 A | 7/1997 | Park et al. | |
| 5,666,350 A | 9/1997 | Huang et al. | |
| 5,668,339 A | 9/1997 | Shin | |
| 5,671,320 A | 9/1997 | Cookson et al. | |
| 5,684,714 A | 11/1997 | Yogeshwar et al. | |
| 5,698,804 A | 12/1997 | Mizuno | |
| 5,703,308 A | 12/1997 | Tashiro et al. | |
| 5,706,145 A | 1/1998 | Hindman et al. | |
| 5,712,950 A | 1/1998 | Cookson et al. | |
| 5,717,763 A | 2/1998 | Choi et al. | |
| 5,732,390 A | 3/1998 | Katayanagi et al. | |
| 5,751,903 A | 5/1998 | Swaminathan et al. | |
| 5,808,569 A | 9/1998 | Wuppermann et al. | |
| 5,811,708 A * | 9/1998 | Matsumoto | 84/610 |
| 5,812,688 A | 9/1998 | Gibson | |
| 5,820,384 A | 10/1998 | Tubman et al. | |
| 5,822,370 A | 10/1998 | Graupe | |
| 5,852,800 A | 12/1998 | Modeste et al. | |
| 5,872,851 A | 2/1999 | Petroff | |
| 5,991,313 A | 11/1999 | Tanaka et al. | |

FOREIGN PATENT DOCUMENTS

| | | | |
|---|---|---|---|
| EP | 0236076 | | 9/1987 |
| JP | 5342762 | | 12/1993 |
| JP | 4092142666 A | * | 8/1997 |
| WO | WO 96/27240 | | 9/1996 |
| WO | WO 97/37449 | | 10/1997 |
| WO | WO 99/08380 | | 2/1999 |

OTHER PUBLICATIONS

ATSC Digital Television Standard, ATSC, Sep. 16, 1995, Annex B. Available on-line at www.atsc.org/Standards/A53/.
Guide to the Use of ATSC Digital Television Standard, ATSC, Oct. 4, 1995, pp. 54-59. Available on-line at www.atsc.org/Standards/A54/.
Digital Audio Compression Standard (AC-3), ATSC, Annex C "AC-3 Karaoke Mode", pp. 127-133. Available on-line at www.atsc.org/Standards/A52/.
Shure Incorporated homepage, available on-line at www.shure.com. The Examiner is encouraged to review the entire website for any relevant subject matter.
Digidesign's web page listing of their Aphex Aural Exciter. Available on-line at www.digidesign.com/products/all_prods.php3?location=main&product_id=8. The Examiner is encouraged to review the entire website for any relevant subject matter.

* cited by examiner

*Primary Examiner*—Ping Lee
(74) *Attorney, Agent, or Firm*—Perkins Coie LLP

(57) ABSTRACT

A method for processing audio signals optimizes the listening experience for hearing impaired listeners, as well as non-hearing impaired listeners, without forcing hearing impaired individuals to feel stigmatized by requiring them to employ special hearing-impaired equipment. A user actuated controller controls a mixture of a preferred audio signal and a remaining audio signal across a range sufficiently wide enough to encompass all individuals. The preferred audio is recorded and maintained separate from all remaining audio and delivered to the listener in a manner that maintains the separateness of the preferred audio and the remaining audio. The user actuated controller includes the capability of automatically maintaining the listener established ratio in the face of changes in the audio signal. The user actuated controller enables the user to specify a range about the ratio in which the audio may vary, which permits the listener to expand the audio across a continuous range to whatever dynamic range his hearing can accommodate. The controller automatically adjusts to changes in incoming audio. The controller can react to relatively slowly moving changes or prevent short bursts of sound in the remaining audio from modifying the signal levels. The combination of the above aspects provides a heretofore not possible listening experience that can accommodate the listening desires of all listeners. The combination of the ability to control the ratio of preferred audio to remaining audio and to specify the dynamic range about the ratio in which the audio may vary, coupled with the ability of the controller to automatically adjust the signal levels in response to sudden changes in incoming audio, provides a powerful user capability that truly optimizes the listening experience for any listener.

10 Claims, 12 Drawing Sheets

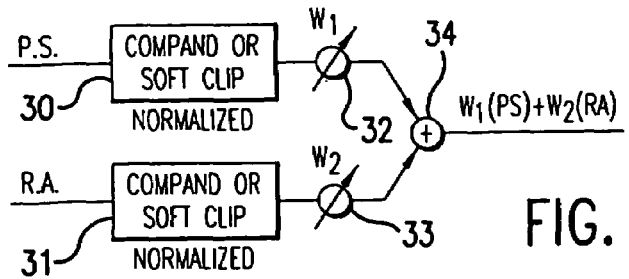
FIG. 11
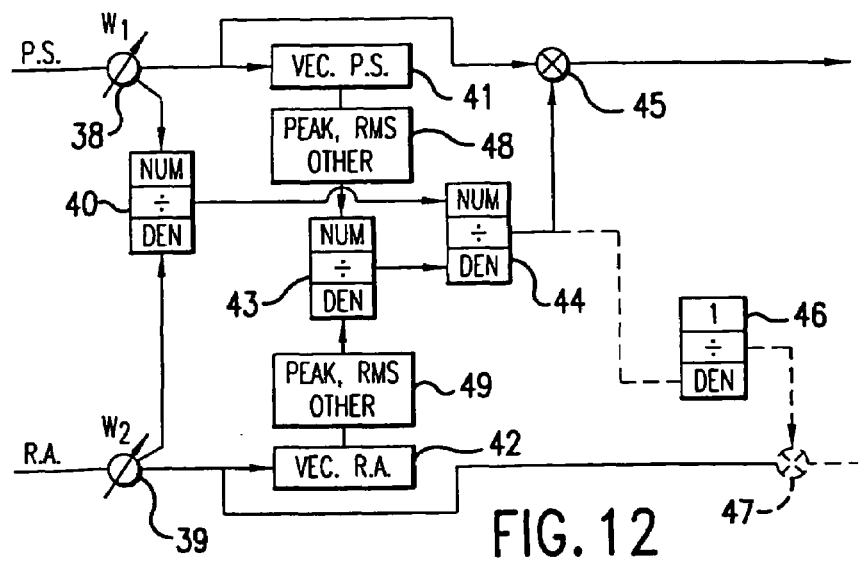
FIG. 12
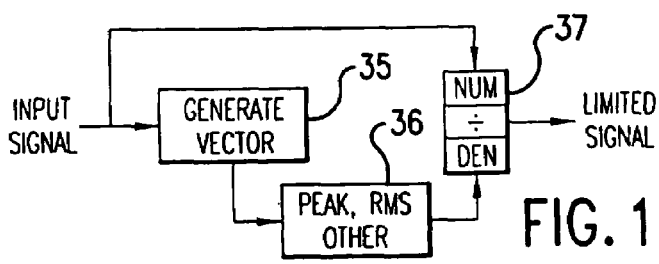
FIG. 13
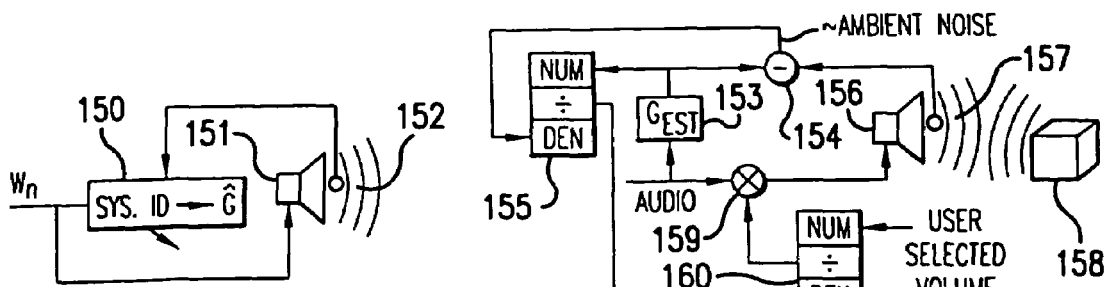
FIG. 14
FIG. 15

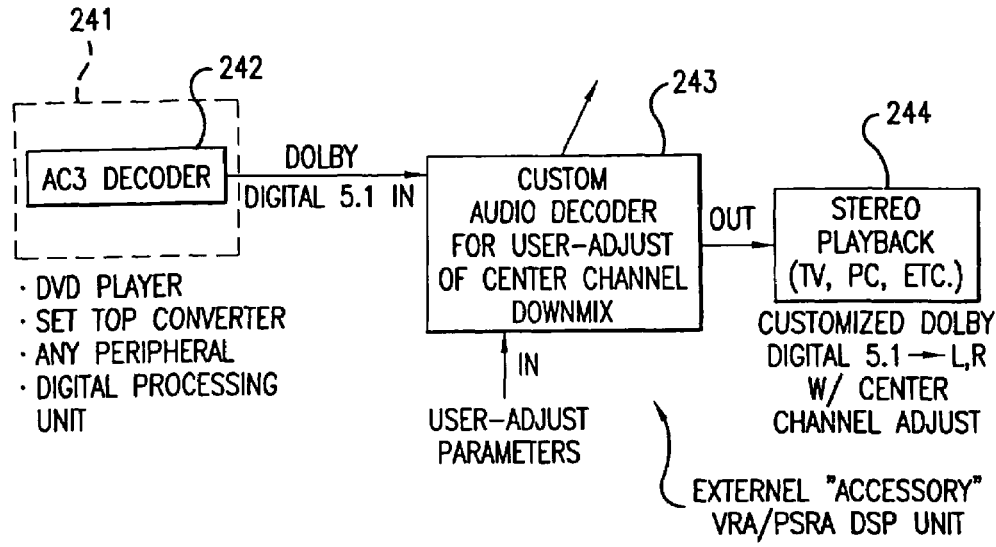
FIG. 24  *EXTERNAL CONFIGURATION FOR PROVISION OF USER-ADJUSTMENT OF CENTER CHANNEL DOWNMIX FROM DOLBY DIGITAL 5.1 TO STEREO (L,R).
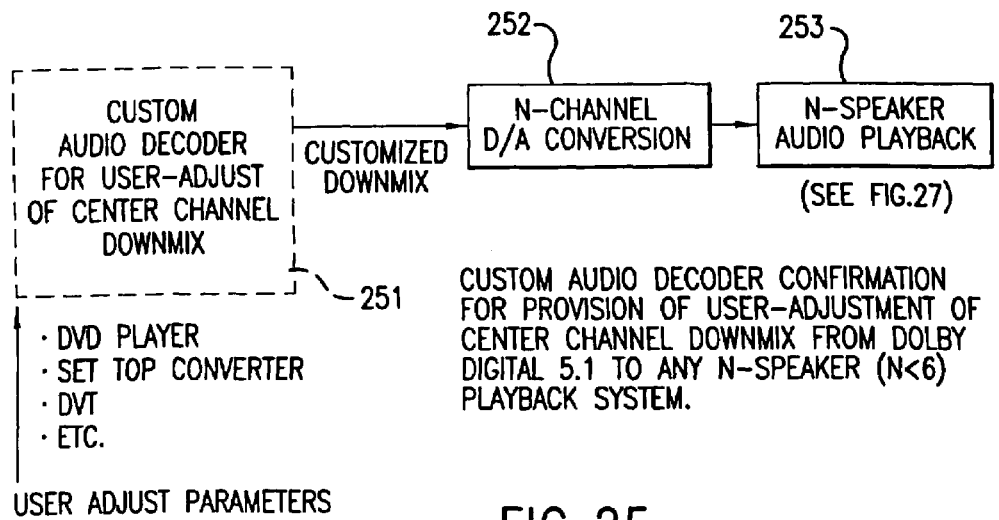
FIG. 25

USER ADJUSTABLE VOLUME CONTROL THAT ACCOMMODATES HEARING

RELATED APPLICATIONS

The present application is related to U.S. patent application Ser. No. 08/852,239 entitled "Hearing Enhancement System and Method" filed on May 6, 1997 by Ronald D. Blum and William E. Kokonaski (HEC-1), which is hereby incorporated by reference, including the drawings, as if repeated herein in its entirety.

The present invention is also related to U.S. patent application Ser. No. 08/907,503 entitled "Listening Enhancement System and Method" filed on Aug. 8, 1997 by Ronald D. Blum and William E. Kokonaski (HEC-2), which is hereby incorporated by reference, including the drawings, as if repeated herein in its entirety.

The present application is a continuation-in-part of U.S. patent application Ser. No. 09/059,307 entitled "Improved Hearing Enhancement System and Method" filed on Apr. 14, 1998 now abandoned by Ronald D. Blum, William E. Kokonaski, William R. Saunders and Michael A. Vaudrey (HEC-3), which is hereby incorporated by reference, including the drawings, as if repeated herein in its entirety.

The present application is also a continuation-in-part of U.S. patent application Ser. No. 09/059,303 entitled "Improved Listening Enhancement System and Method" filed on Apr. 14, 1998 now abandoned by Ronald D. Blum, William E. Kokonaski, William R. Saunders and Michael A. Vaudrey (HEC-4), which is hereby incorporated by reference, including the drawings, as if repeated herein in its entirety.

The present application is also a continuation-in-part of U.S. patent application Ser. No. 09/059,304, entitled "Improved Aural System and Method" filed on Apr. 14, 1998 now abandoned by William R. Saunders and Michael A. Vaudrey (HEC-5), which is hereby incorporated by reference, including the drawings, as if repeated herein in its entirety.

The present application also claims priority to U.S. Provisional Application No. 60/109,506 entitled "Special Application Digital Audio Decoder" filed on Nov. 23, 1998 by William R. Saunders and Michael A. Vaudrey (HEC-6), which is hereby incorporated by reference, including the drawings, as if repeated herein in its entirety.

BACKGROUND OF THE INVENTION

The present invention relates generally to methods and apparatus for processing audio, and more particularly to a method and apparatus for processing audio to improve the listening experience for a broad range of listeners, including hearing impaired listeners.

As one ages and progresses through life, over time due to many factors, such as age, genetics, disease, and environmental effects, one's hearing becomes compromised. Usually, the deterioration is specific to certain frequency ranges.

In addition to permanent hearing impairments, one may experience temporary hearing impairments due to exposure to particular high sound levels. For example, after target shooting or attending a rock concert one may have temporary hearing impairments that improve somewhat, but over time may accumulate to a permanent hearing impairment. Even lower sound levels than these but longer lasting may have temporary impacts on one's hearing, such as working in a factory or teaching in a elementary school.

Typically, one compensates for hearing loss or impairment by increasing the volume of the audio. But, this simply increases the volume of all audible frequencies in the total signal. The resulting increase in total signal volume will provide little or no improvement in speech intelligibility, particularly for those whose hearing impairment is frequency dependent.

While hearing impairment increases generally with age, many hearing impaired individuals refuse to admit that they are hard of hearing, and therefore avoid the use of devices that may improve the quality of their hearing. While many elderly people begin wearing glasses as they age, a significantly smaller number of these individuals wear hearing aids, despite the significant advances in the reduction of the size of hearing aids. This phenomenon is indicative of the apparent societal stigma associated with hearing aids and/or hearing impairments. Consequently, it is desirable to provide a technique for improving the listening experience of a hearing impaired listener in a way that avoids the apparent associated societal stigma.

Most audio programming, be it television audio, movie audio, or music can be divided into two distinct components: the foreground and the background. In general, the foreground sounds are the ones intended to capture the audiences attention and retain their focus, whereas the background sounds are supporting, but not of primary interest to the audience. One example of this can be seen in television programming for a "sitcom," in which the main character's voices deliver and develop the plot of the story while sound effects, audience laughter, and music fill the gaps.

Currently, the listening audience for all types of audio media are restricted to the mixture decided upon by the audio engineer during production. The audio engineer will mix all other background noise components with the foreground sounds at levels that the audio engineer prefers, or at which the audio engineer understands have some historical basis. This mixture is then sent to the end user as either a single (mono) signal or in some cases as a stereo (left and right) signal, without any means for adjusting the foreground to the background.

The lack of this ability to adjust foreground relative to background sounds is particularly difficult for the hearing impaired. In many cases, programming is difficult to understand (at best) due to background audio masking the foreground signals.

There are many new digital audio formats available. Some of these have attempted to provide capability for the hearing impaired. For example, Dolby Digital, also referred to as AC-3 (or Audio Codec version 3), is a compression technique for digital audio that packs more data into a smaller space. The future of digital audio is in spatial positioning, which is accomplished by providing 5.1 separate audio channels: Center, Left and Right, and Left and Right Surround. The sixth channel, referred to as the 0.1 channel refers to a limited bandwidth low frequency effects (LFE) channel that is mostly non-directional due to its low frequencies. Since there are 5.1 audio channels to transmit, compression is necessary to ensure that both video and audio stay within certain bandwidth constraints. These constraints (imposed by the FCC) are more strict for terrestrial transmission than for DVD, currently. There is more than enough space on a DVD to provide the user with uncompressed audio (much more desirable from a listening standpoint). Video data is compressed most commonly through MPEG (moving pictures experts group) developed techniques, although they also have an audio compression technique very similar to Dolby's.

The DVD industry has adopted Dolby Digital (DD) as its compression technique of choice. Most DVD's are produced using DD. The ATSC (Advanced Television Standards Committee) has also chosen AC-3 as its audio compression scheme for American digital TV. This has spread to many other countries around the world. This means that production studios (movie and television) must encode their audio in DD for broadcast or recording.

There are many features, in addition to the strict encoding and decoding scheme, that are frequently discussed in conjunction with Dolby Digital. Some of these features are part of DD and some are not. Along with the compressed bitstream, DD sends information about the bitstream called metadata, or "data about the data." It is basically zero's and ones indicating the existence of options available to the end user. Three of these options that are relevant to HEC are dialnorm (dialog normalization), dynrng (dynamic range), and bsmod (bit stream mode that controls the main and associated audio services). The first two are an integral part of DD already, since many decoders handle these variables, giving end users the ability to adjust them. The third bit of information, bsmod, is described in detail in ATSC document A/54 (not a Dolby publication) but also exists as part of the DD bitstream. The value of bsmod alerts the decoder about the nature of the incoming audio service, including the presence of any associated audio service. At this time, no known manufacturers are utilizing this parameter. Multiple language DVD performances are provided via multiple complete main audio programs on one of the eight available audio tracks on the DVD.

The dialnorm parameter is designed to allow the listener to normalize all audio programs relative to a constant voice level. Between channels and between program and commercial, overall audio levels fluctuate wildly. In the future, producers will be asked to insert the dialnorm parameter which indicates the level (SPL) at which the dialog has been recorded. If this value is set as 80 dB for a program but 90 dB for a commercial, the television will decode that information examine the level the user has entered as desirable (say 85 dB) and will adjust the movie up 5 dB and the commercial down 5 dB. This is a total volume level adjustment that is based on what the producer enters as the dialnorm bit value.

A section from the AC-3 description (from document A/52) provides the best description of this technology. "The dynrng values typically indicate gain reduction during the loudest signal passages, and gain increase during the quiet passages. For the listener, it is desirable to bring the loudest sounds down in level towards the dialog level, and the quiet sounds up in level, again towards dialog level. Sounds which are at the same loudness as the normal spoken dialogue will typically not have their gain changed."

The dynrng variable provides the user with an adjustable parameter that will control the amount of compression occurring on the total volume with respect to the dialog level. This essentially limits the dynamic range of the total audio program about the mean dialog level. This does not, however, provide any way to adjust the dialog level independently of the remaining audio level.

One attempt to improve the listening experience of hearing impaired listeners is provided for in The ATSC, Digital Television Standard (Annex B). Section 6 of Annex B of the ATSC standard describes the main audio services and the associated audio services. An AC-3 elementary stream contains the encoded representation of a single audio service. Multiple audio services are provided by multiple elementary streams. Each elementary stream is conveyed by the transport multiplex with a unique PID. There are a number of audio service types which may be individually coded into each elementary stream. One of the audio service types is called the complete main audio service (CM). The CM type of main audio service contains a complete audio program (complete with dialogue, music and effects). The CM service may contain from 1 to 5.1 audio channels. The CM service may be further enhanced by means of the other services. Another audio service type is the hearing impaired service (HI). The HI associated service typically contains only dialogue which is intended to be reproduced simultaneously with the CM service. In this case, the HI service is a single audio channel. As stated therein, this dialogue may be processed for improved intelligibility by hearing impaired listeners. Simultaneous reproduction of both the CM and HI services allows the hearing impaired listener to hear a mix of the CM and HI services in order to emphasize the dialogue while still providing some music and effects. Besides providing the HI service as a single dialogue channel, the HI service may be provided as a complete program mix containing music, effects, and dialogue with enhanced intelligibility. In this case, the service may be coded using any number of channels (up to 5.1). While this service may improve the listening experience for some hearing impaired individuals, it certainly will not for those who do not employ the proscribed receiver for fear of being stigmatized as hearing impaired. Finally, any processing of the dialogue for hearing impaired individuals prevents the use of this channel in creating an audio program for non-hearing individuals. Moreover, the relationship between the HI service and the CM service set forth in Annex B remains undefined with respect to the relative signal levels of each used to create a channel for the hearing impaired.

Other techniques have been employed to attempt to improve the intelligibility of audio. For example, U.S. Pat. No. 4,024,344 discloses a method of creating a "center channel" for dialogue in cinema sound. This technique disclosed therein correlates left and right stereophonic channels and adjusts the gain on either the combined and/or the separate left or right channel depending on the degree of correlation between the left and right channel. The assumption being that the strong correlation between the left and right channels indicates the presence of dialogue. The center channel, which is the filtered summation of the left and right channels, is amplified or attenuated depending on the degree of correlation between the left and right channels. The problem with this approach is that it does not discriminate between meaningful dialogue and simple correlated sound, nor does it address unwanted voice information within the voice band. Therefore, it cannot improve the intelligibility of all audio for all hearing impaired individuals.

The separation of voice from background audio in television signals is discussed by Shiraki in U.S. Pat. No. 5,197,100. The technique employed by Shiraki involves the use of band pass filtering in combination with summing and subtracting circuits to form a "voice channel" that would be differentiated from the rest of the audio programming. The limitation of this approach is that the band pass filter only discriminates frequencies within a predetermined range, in this case 200 Hz to 500 Hz. It cannot discriminate between voice and background audio that may happen to fall within the band pass frequency. Furthermore, the application of band pass filtering cannot distinguish between relevant and irrelevant speech-components within an audio signal.

Means of reducing background noise in audio frames have been discussed by Solve et al. in U.S. Pat. No. 5,485,522 which discloses a speech detector and a noise estimator used to adaptively adjust attenuation to each frame of an audio signal. This and other forms of Adaptive Noise Filtering cannot distinguish between voice and other non-stationary audio in the voice band, such as music or irrelevant voice information. Consequently, the improvement in intelligibility is less than optimum.

Attempts to improve the listening experience by modifying the signal level in the face of large noise variations have been made. For example, U.S. Pat. No. 5,434,922 to Miller et al. discloses a method and system for sound optimization which measures both the music and noise in a vehicle. Miller et al. uses analog to digital conversions and adaptive filtering with algorithms to compensate for the ambient noise background by enhancing the sound signal automatically. This technique cannot compensate for a preferred audio signal that is overwhelmed by the remaining audio signal for a particular listener. In the system of Miller et al., the system merely increases the total signal level in an attempt to overcome the presence of road and engine noise. In most cases, audio that was not intelligible to a particular listener does not become intelligible by merely increasing the signal level.

In general, prior art techniques employing band pass filtering or selective equalization will not remove voice band background or noise within the voice band range from speech components of the audio program. The previously cited inventions of Dolby, Shiraki and Miller et al. have all attempted to modify some content of the audio signal through various signal processing hardware or algorithms, but those methods do not satisfy the individual needs or preferences of different listeners. In sum, all of these techniques provide a less than optimum listening experience for hearing impaired individuals as well as non-hearing impaired individuals.

Finally, in the case of studio recordings, vocals are usually recorded separately and are later mixed with the instrumentals and placed on a single recording track. The end user is therefore enabled to only adjust the volume, tone and balance (in the case of stereo), but not the relative signal levels of the voice component or the background component.

The present invention is therefore directed to the problem of developing a system and method for processing audio signals that optimizes the listening experience for hearing impaired listeners, as well as non-hearing impaired listeners, without forcing hearing impaired individuals to feel stigmatized by requiring them to employ special hearing-impaired equipment.

SUMMARY OF THE INVENTION

The present invention solves this problem by providing a user actuated controller that controls a mixture of a preferred audio signal and a remaining audio signal across a range sufficiently wide enough to encompass all individuals, from hearing impaired listeners to non-hearing impaired listeners. By providing a controller that all listeners employ to optimizes their listening experience to their unique hearing requirements, the present invention prevents the attachment of any societal stigma to the use of such a controller. Moreover, the present invention therefore does not require the use of specialized equipment for the hearing impaired, and the concomitant costs usually associated with such special equipment due to the small manufacturing quantities, and the higher percentage of research and development recovery costs associated with each unit.

According to another aspect of the present invention, the preferred audio is recorded and maintained separate from all remaining audio and delivered to the listener (or end user) in a manner that maintains the separateness of the preferred audio and the remaining audio. This enables the end user to have complete control over the ratio of the mixture, which can be adjusted by the end user to accommodate his or her hearing impairments at the time of playing the audio, rather than at the time the audio is being recorded. Moreover, maintaining the two audio sources separate permits the user to make adjustments depending upon the type of audio being played, the composition of the audience, i.e., to attempt to find a compromise setting that meet the needs of several individuals listening to the audio, the exact surroundings, including external noise sources, room acoustics, etc. In fact, the present invention thus provides unlimited flexibility in playing the audio that was heretofore not possible.

According to another aspect of the present invention, the user actuated controller includes the capability of automatically maintaining the listener established ratio in the face of changes in the audio signal. In other words, if the signal level of the remaining audio suddenly changes, the controller automatically adjusts the signal level of either the preferred audio or the signal level of the remaining audio to compensate. In this case, if the action moves to an outdoor windy area that tends to obscure the preferred audio, the listener need not re-adjust the ratio setting to compensate. Rather, the controller automatically corrects for this change.

According to yet another aspect of the present invention, the user actuated controller enables the user to specify a range about the ratio in which the audio may vary to provide for a user specifiable dynamic range. This permits the listener to expand the audio across a continuous range to whatever dynamic range his hearing can accommodate. So, a young listener may set a value for the preferred audio to remaining audio ratio and then open the dynamic range completely, thereby providing for complete freedom of the audio, whereas an older listener with compromised hearing may specify a very narrow range about the specified ratio, in which range the audio is limited to vary. Reducing the dynamic range to the point where the preferred audio signal is maintained without variation creates a monotone signal, which may be necessary for a severely hearing impaired individual to understand the audio, but this may not be required for an individual with a milder hearing impairment. The adjustability of this range lets the user create his optimum listening experience, which may vary greatly depending upon multiple factors that can be best accounted for at the time of playing the audio program rather than at the time of recording the audio program.

According to yet another aspect of the present invention, the controller automatically adjusts to changes in incoming audio, however, the controller can react to relatively slowly moving changes or prevent short bursts of sound in the remaining audio from modifying the signal levels. Thus, a gun shot may or may not overwhelm any preferred audio depending on the user's listening desires.

The combination of the above aspects of the present invention provides a heretofore not possible listening experience that can accommodate the listening desires of all listeners. The combination of the ability to control the ratio of preferred audio to remaining audio and to specify the dynamic range about the ratio in which the audio may vary, coupled with the ability of the controller to automatically adjust the signal levels in response to sudden changes in incoming audio, provides a powerful user capability that truly optimizes the listening experience for any listener.

BRIEF DESCRIPTION OF THE DRAWINGS

FIG. 11 illustrates a simplified block diagram of an exemplary embodiment according to the present invention for soft-clipping of both the preferred signal and remaining audio for the purpose of automatically maintaining a user selected preferred signal to remaining audio (PSRA) ratio.

FIG. 12 illustrates an exemplary embodiment according to the present invention for implementing a soft-clipping method as shown in FIG. 11.

FIG. 13 is a detailed block diagram illustrating an exemplary method according to the present invention for maintaining the level of either the preferred audio signal or the remaining audio signal in the presence of transients in either signal.

FIG. 14 illustrates the first step in performing ambient noise measurement for the purpose of automatic volume adjustment, system identification according to one aspect of the present invention.

FIG. 15 is a block diagram illustrating the automatic volume adjustment process to compensate for changes in the ambient noise in a listening environment according to another aspect of the present invention.

FIG. 24 illustrates one conceptual diagram of how a downmix would be implemented according to the present invention.

FIG. 25 shows that this downmix capability according to the present invention could be built into the primary audio decoder that is utilized by any DVD, DTV, or any other digital audio playback device that is intended to decode and distribute audio signals to the speakers.

DETAILED DESCRIPTION

Figure 1:
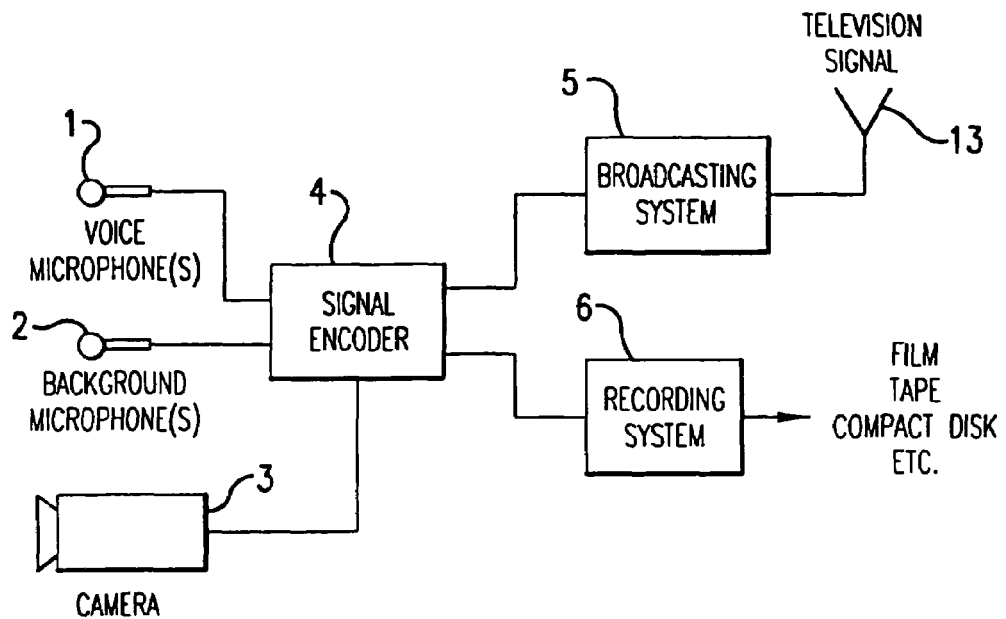
FIG. 1 illustrates a general approach according to the present invention for separating relevant voice information from general background audio in a recorded or broadcast program.

While much of the following description includes examples of the technologies used in conjunction with digital Dolby, the present invention can be used with any audio codec with multiple transmission capability, such as DTS, THX, SDDS, PCM, etc.

Significance of Ratio of Preferred Audio to Remaining Audio

The present invention begins with the realization that the listening preferential range of a ratio of a preferred audio signal relative to any remaining audio is rather large, and certainly larger than ever expected. This significant discovery is the result of a test of a large sample of the population regarding their preferences of the ratio of the preferred audio signal level to a signal level of all remaining audio.

Specific Adjustment of Desired Range for Hearing Impaired or Normal Listeners

Very directed research has been conducted in the area of understanding how normal and hearing impaired users perceive the ratio between dialog and remaining audio for different types of audio programming. It has been found that the population varies widely in the range of adjustment desired between voice and remaining audio.

Two experiments have been conducted on a random sample of the population including elementary school children, middle school children, middle-aged citizens and senior citizens. A total of 71 people were tested. The test consisted of asking the user to adjust the level of voice and the level of remaining audio for a football game (where the remaining audio was the crowd noise) and a popular song (where the remaining audio was the music). A metric called the VRA (voice to remaining audio) ratio was formed by dividing the linear value of the volume of the dialog or voice by the linear value of the volume of the remaining audio for each selection. These ratios are plotted in FIG. 29. For the music the minimum ratio was 0.1 (indicating very little voice) while the maximum ratio was 9.54 (indicated a large amount of voice). The sports test had a minimum ratio of 0.33 and a maximum ratio of 20.17.

Several things were made clear as a result of this testing. First, no two people prefer the identical ratio for voice and remaining audio for both the sports and music media. This is very important since the population has relied upon producers to provide a VRA (which cannot be adjusted by the consumer) that will appeal to everyone. This can clearly not occur, given the results of these tests. Second, while the VRA is typically higher for those with hearing impairments (to improve intelligibility) those people with normal hearing also prefer different ratios than are currently provided by the producers.

It is also important to highlight the fact that any device that provides adjustment of the VRA must provide at least as much adjustment capability as is inferred from these tests in order for it to satisfy a significant segment of the population. Since the video and home theater medium supplies a variety of programming, we should consider that the ratio should extend from at least the lowest measured ratio for any media (music or sports) to the highest ratio from music or sports. This would be 0.1 to 20.17, or a range in decibels of 46 dB. It should also be noted that this is merely a sampling of the population and that the adjustment capability should theoretically be infinite since it is very likely that one person may prefer no crowd noise when viewing a sports broadcast and that another person would prefer no announcement. Note that this type of study and the specific desire for widely varying VRA ratios has not been reported or discussed in the literature or prior art.

In this test, an older group of men was selected and asked to do an adjustment (which test was later performed on a group of students) between a fixed background noise and the voice of an announcer, in which only the latter could be varied and the former was set at 6.00. The results with the older group were as follows:

TABLE I

| Individual | Setting |
| --- | --- |
| 1 | 7.50 |
| 2 | 4.50 |
| 3 | 4.00 |
| 4 | 7.50 |
| 5 | 3.00 |
| 6 | 7.00 |
| 7 | 6.50 |
| 8 | 7.75 |
| 9 | 5.50 |
| 10 | 7.00 |
| 11 | 5.00 |

To further illustrate the fact that people of all ages have different hearing needs and preferences, a group of 21 college students was selected to listen to a mixture of voice and background and to select, by making one adjustment to the voice level, the ratio of the voice to the background. The background noise, in this case crowd noise at a football game, was fixed at a setting of six (6.00) and the students were allowed to adjust the volume of the announcers' play by play voice which had been recorded separately and was pure voice or mostly pure voice. In other words, the students were selected to do the same test the group of older men did. Students were selected so as to minimize hearing infirmities caused by age. The students were all in their late teens or early twenties. The results were as follows:

TABLE II

| Student | Setting of Voice |
| --- | --- |
| 1 | 4.75 |
| 2 | 3.75 |
| 3 | 4.25 |
| 4 | 4.50 |
| 5 | 5.20 |
| 6 | 5.75 |
| 7 | 4.25 |
| 8 | 6.70 |
| 9 | 3.25 |
| 10 | 6.00 |
| 11 | 5.00 |
| 12 | 5.25 |
| 13 | 3.00 |
| 14 | 4.25 |
| 15 | 3.25 |
| 16 | 3.00 |
| 17 | 6.00 |
| 18 | 2.00 |
| 19 | 4.00 |
| 20 | 5.50 |
| 21 | 6.00 |

The ages of the older group (as seen in Table 1) ranged from 36 to 59 with the preponderance of the individuals being in the 40 or 50 year old group. As is indicated by the test results, the average setting tended to be reasonably high indicating some loss of hearing across the board. The range again varied from 3.00 to 7.75, a spread of 4.75 which confirmed the findings of the range of variance in people's preferred listening ratio of voice to background or any preferred signal to remaining audio (PSRA). The overall span for the volume setting for both groups of subjects ranged from 2.0 to 7.75. These levels represent the actual values on the volume adjustment mechanism used to perform this experiment. They provide an indication of the range of signal to noise values (when compared to the "noise" level 6.0) that may be desirable from different users.

To gain a better understanding of how this relates to relative loudness variations chosen by different users, consider that the non-linear volume control variation from 2.0 to 7.75 represents an increase of 20 dB or ten (10) times. Thus, for even this small sampling of the population and single type of audio programming it was found that different listeners do prefer quite drastically different levels of "preferred signal" with respect to "remaining audio." This preference cuts across age groups showing that it is consistent with individual preference and basic hearing abilities, which was heretofore totally unexpected.

As the test results show, the range that students (as seen in Table II) without hearing infirmities caused by age selected varied considerably from a low setting of 2.00 to a high of 6.70, a spread of 4.70 or almost one half of the total range of from 1 to 10. The test is illustrative of how the "one size fits all" mentality of most recorded and broadcast audio signals falls far short of giving the individual listener the ability to adjust the mix to suit his or her own preferences and hearing needs. Again, the students had a wide spread in their settings as did the older group demonstrating the individual differences in preferences and hearing needs. One result of this test is that hearing preferences is widely disparate.

Figure 29:
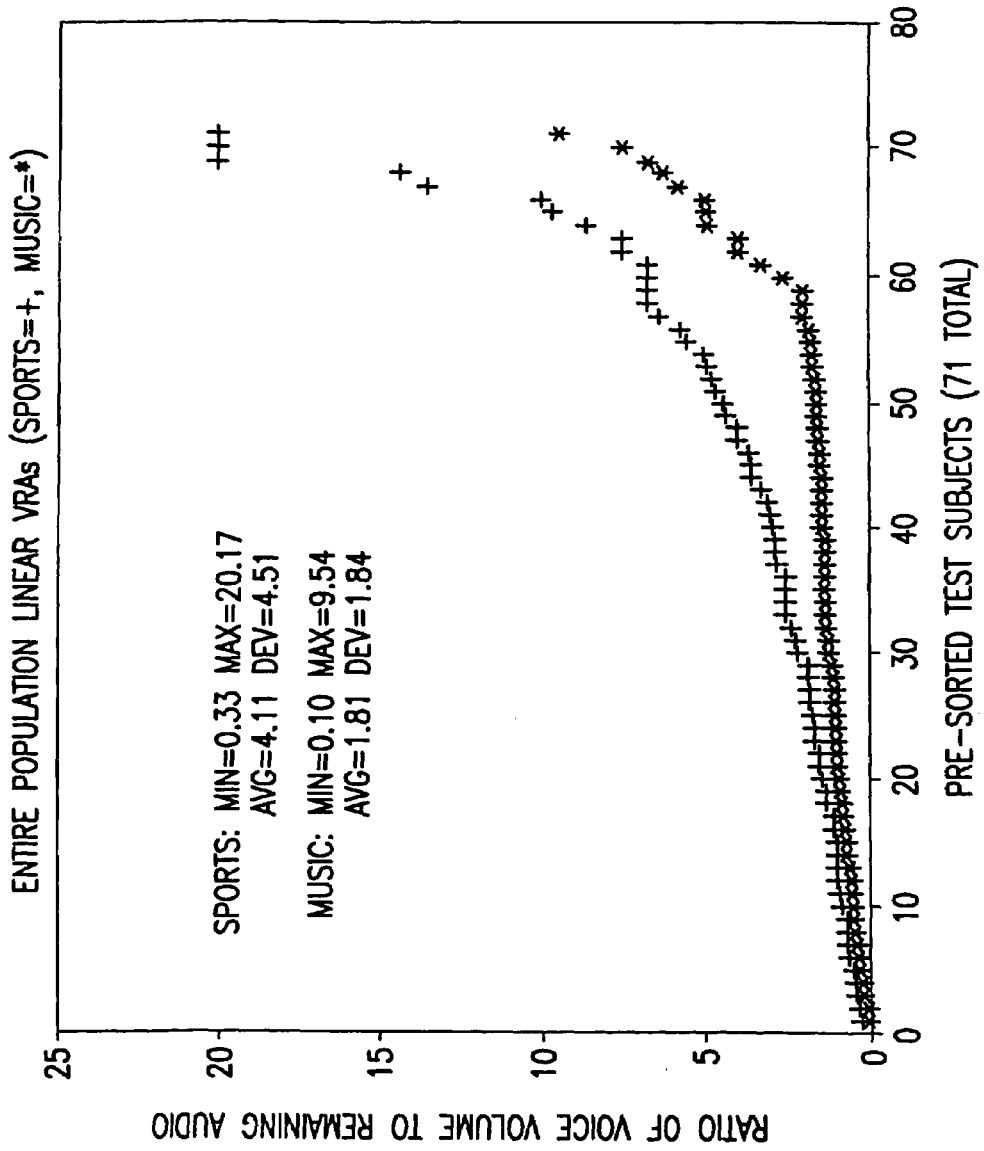
FIG. 29 depicts the results of two experiments conducted on a random sample of the population including elementary school children, middle school children, middle-aged citizens and senior citizens, measuring the voice-to-remaining audio setting preferred by each subject.

Further testing has confirmed this result over a larger sample group. Moreover, the results vary depending upon the type of audio. For example, as shown in FIG. 29, when the audio source was music, the ratio of voice to remaining audio varied from approximately zero to about 10, whereas when the audio source was sports programming, the same ratio varied between approximately zero and about 20. In addition, the standard deviation increased by a factor of almost three, while the mean increased by more than twice that of music.

The end result of the above testing is that if one selects a preferred audio to remaining audio ratio and fixes that forever, one has most likely created an audio program that is less than desirable for a significant fraction of the population. And, as stated above, the optimum ratio may be both a short-term and long-term time varying function. Consequently, complete control over this preferred audio to remaining audio ratio is desirable to satisfy the listening needs of "normal" or non-hearing impaired listeners. Moreover, providing the end user with the ultimate control over this ratio allows the end user to optimize his or her listening experience.

The end-user's independent adjustment of the preferred audio signal and the remaining audio signal will be the apparent manifestation of one aspect of the present invention. To illustrate the details of the present invention, consider the application where the preferred audio signal is the relevant voice information.

Creation of the Preferred Audio Signal and the Remaining Audio Signal

FIG. 1 illustrates a general approach to separating relevant voice information from general background audio in a recorded or broadcast program. There will first need to be a determination made by the programming director as to the definition of relevant voice. An actor, group of actors, or commentators must be identified as the relevant speakers.

Once the relevant speakers are identified, their voices will be picked up by the voice microphone 1. The voice microphone 1 will need to be either a close talking microphone (in the case of commentators) or a highly directional shot gun microphone used in sound recording. In addition to being highly directional, these microphones 1 will need to be voice-band limited, preferably from 200-5000 Hz. The combination of directionality and band pass filtering minimize the background noise acoustically coupled to the relevant voice information upon recording. In the case of certain types of programming, the need to prevent acoustic coupling can be avoided by recording relevant voice of dialogue off-line and dubbing the dialogue where appropriate with the video portion of the program. The background microphones 2 should be fairly broadband to provide the full audio quality of background information, such as music.

A camera 3 will be used to provide the video portion of the program. The audio signals (voice and relevant voice) will be encoded with the video signal at the encoder 4. In general, the audio signal is usually separated from the video signal by simply modulating it with a different carrier frequency. Since most broadcasts are now in stereo, one way to encode the relevant voice information with the background is to multiplex the relevant voice information on the separate stereo channels in much the same way left front and right front channels are added to two channel stereo to produce a quadraphonic disc recording. Although this would create the need for additional broadcast bandwidth, for recorded media this would not present a problem, as long as the audio circuitry in the video disc or tape player is designed to demodulate the relevant voice information.

Once the signals are encoded, by whatever means deemed appropriate, the encoded signals are sent out for broadcast by broadcast system 5 over antenna 13, or recorded on to tape or disc by recording system 6. In case of recorded audio video information, the background and voice information could be simply placed on separate recording tracks.

Receiving and Demodulating the Preferred Audio Signal and the Remaining Audio

Figure 2:
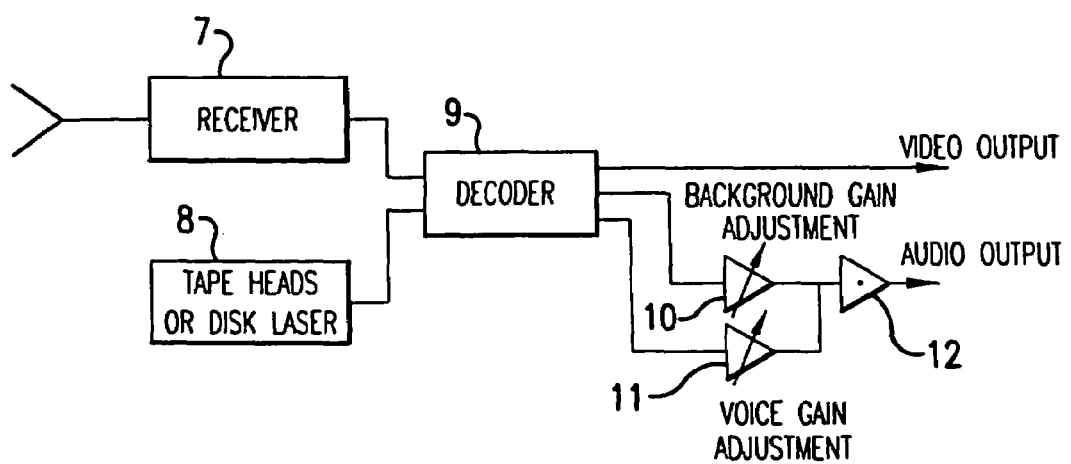
FIG. 2 illustrates an exemplary embodiment according to the present invention for receiving and playing back the encoded program signals.

FIG. 2 illustrates an exemplary embodiment for receiving and playing back the encoded program signals. A receiver system 7 demodulates the main carrier frequency from the encoded audio/video signals, in the case of broadcast information. In the case of recorded media, the heads from a VCR or the laser reader from a CD player 8 would produce the encoded audio/video signals.

In either case, these signals would be sent to a decoding system 9. The decoder 9 would separate the signals into video, voice audio, and background audio using standard decoding techniques such as envelope detection in combination with frequency or time division demodulation. The background audio signal is sent to a separate variable gain amplifier 10, that the listener can adjust to his or her preference. The voice signal is sent to a variable gain amplifier 11, that can be adjusted by the listener to his or her particular needs, as discussed above.

The two adjusted signals are summed by a unity gain summing amplifier 12 to produce the final audio output. In this manner the listener can adjust relevant voice to background levels to optimize the audio program to his or her unique listening requirements at the time of playing the audio program. As each time the same listener plays the same audio, the ratio setting may need to change due to changes in the listener's hearing, the setting remains infinitely adjustable to accommodate this flexibility.

Voice Recognition Used to Create Audio Channel

Figure 3:
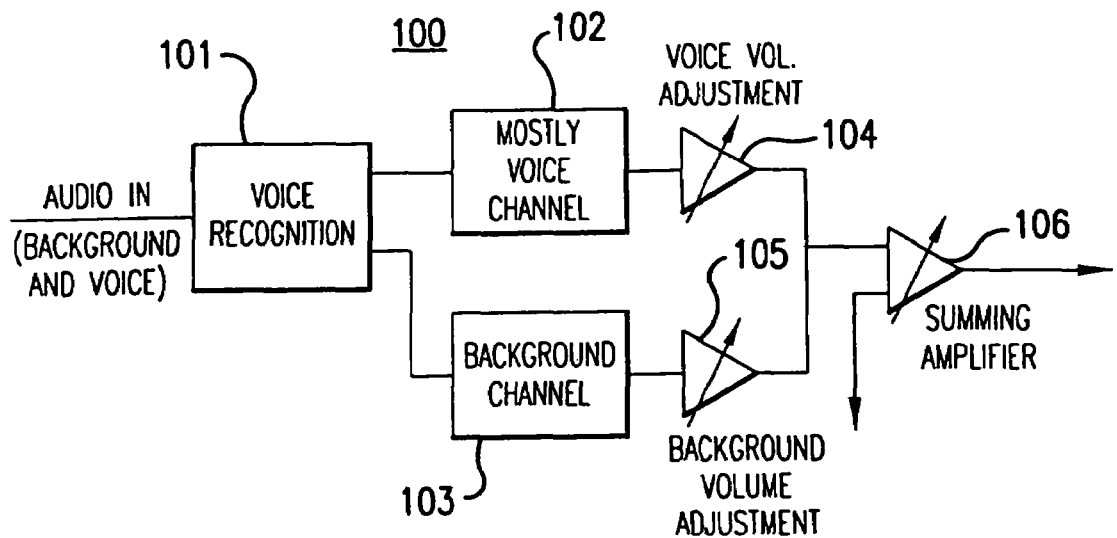
FIG. 3 illustrates one exemplary technique in which the preferred signal can be delivered to the end user through voice recognition.

Referring to FIG. 3, there is shown a diagram of yet another exemplary embodiment of the present invention, which is a system 100 utilizing a voice recognition chip 101 that separates the information into a mostly voice channel 102 and a background noise channel 103 after recognizing the speech components of the incoming signal. The mostly voice-like components are separated from the background components and grouped into separate data streams. The signals are then converted back to analog signals to create a mostly voice channel and a background noise channel.

As in FIG. 2, the mostly voice channel 102 is fed to a signal level adjustable amplifier 104, which performs the voice volume adjustment, and the background channel 103 is fed to a second signal level adjustable amplifier 105, which performs the background volume adjustment. The outputs of the amplifiers 104, 105 are summed in a summing amplifier 106 to create the final audio.

Voice Recognition (Digital Version)

Figure 4:
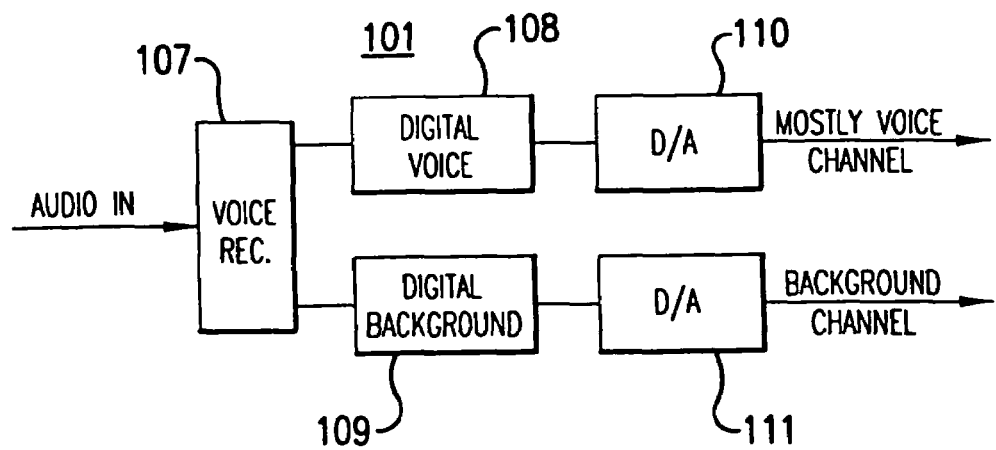
FIG. 4 shows a circuit diagram of a digital version of the voice recognition device depicted in FIG. 3.

FIG. 4 shows a circuit diagram of the digital version of the voice recognition device 101. The audio signal is received, converted into a digital signal and separated into digital voice 108 and digital background 109 signals by voice recognizer 107. The digital signals are then converted back to an analog signal by digital-to-analog converters 110, 111.

Voice Recognition Chip Tailored to User's Malady

A further embodiment of the instant invention utilizes a chip which is programmable and by initialization is tailored to each user's malady. For example, the user's particular frequency loss can be separated out from the incoming signal, and passed through the mostly voice channel, thereby enabling the user to control the ratio of these frequencies relative to all other frequencies. It is understood that the system and method are adaptable to both analog and digital signals.

For the present invention, if the application is to increase the listening pleasure of the end-user, it is possible to change the voice microphone 1 to read the preferred signal microphone and the background microphone 2 to read the remaining audio signal microphone. Then, the rest of the means for providing the end-listener independent adjustment of the preferred signal and remaining audio will follow exactly as the preceding discussion.

The present invention provides the end user with the ability to adjust the level of the foreground audio (also called the preferred signal) relative to the background audio (also called the remaining audio). In the most general sense, the preferred signal represents any audio component which is the immediate focus in the programming while the remaining audio represents all other sound components delivered simultaneously with that signal. It should be noted that the remaining audio is still considered to be important programming for the enjoyment of the total audio signal, but in its current design, may be obscuring more important components in the total audio signal. For example, an orchestral movement may contain a rather lengthy flute solo which is the immediate focus. (Many hearing impaired persons have the most trouble with the upper frequency range, frequencies where the flute sounds mainly reside). In most cases it would not be desirable to completely eliminate all instruments except for the flute, even though the flute is the primary focus of this particular movement. The remaining orchestral instruments add to the enjoyment of the flute solo, but in order to hear it more clearly, the end user needs to adjust the level of the flute only to his/her own taste and hearing needs.

The idea of adjusting the preferred signal volume level over the remaining audio level in a total audio signal spans all current and future media. By way of example and not as an exhaustive list, the present invention is applicable to television, CD, DVD, video tape, movies, computer animation, and radio, audio transmitted over the Internet, flash RAM storage, and computer generated audio.

OVERALL PROCESS OF THE PRESENT INVENTION

Figure 5:
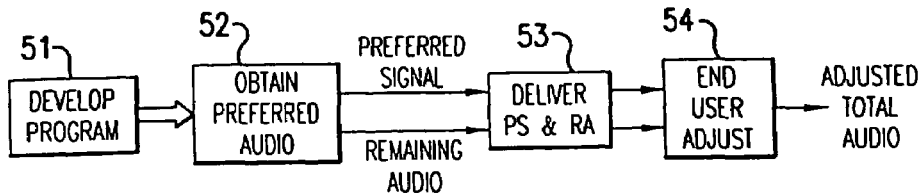
FIG. 5 illustrates a generalized block diagram of a path that a preferred signal versus a remaining audio signal might take for any general media type before it arrives at the end user according to the present invention.

FIG. 5 illustrates an exemplary embodiment of the overall process according to the present invention for creating the required signal for any media format in general and for delivering that required signal to the end user, which in this case is the ordinary consumer or purchaser. Essentially, there are four main steps in this process. Step 1 (element 51), the program to be played to the end user is developed. Step 2 (element 52), the preferred audio is obtained separately from the remaining audio. Step 3 (element 53), the preferred signal and remaining audio are delivered to the end user in a manner that maintains the separateness of the preferred signal and remaining audio. Step 4 (element 54), the end user is provided with the ability to adjust the relative signal levels of the preferred signal and remaining audio.

ALTERNATIVE EMBODIMENT

For each of these mediums, there exist ways to obtain (step 2) and deliver the preferred signal to the end user (step 3), with minimal impact on the listener who is satisfied with the current preferred signal to remaining audio (PSRA) mix, determined by an audio engineer. However, it has been shown that individuals with generally normal hearing prefer to have control over the PSRA mixture for at least some forms of programming.

One aspect of the present invention described herein begins with possible ways for certain media formats, in which the preferred signal can be delivered to the end user without affecting the current mixture of the total audio signal. Then, turning toward the end user adjustment controls (step 4), without loss of generality, several additional aspects of the present invention are presented.

Separate Broadband Equalization of the Preferred Audio Signal and the Remaining Audio Signal First, improvements in the flexibility of adjusting the preferred signal to remaining audio mixture are realized in the form of broadband equalization of the preferred and remaining audio signals separately. This will provide the end user with even more flexibility in reaching his/her desired listening quality above and beyond that which is achievable using simple gain adjustment.

Maintaining the PSRA Ratio in the Face of Large Transients

Next, an aspect of the present invention is discussed in which the preferred signal to remaining audio (PSRA) adjustment selected by the end user and can be stored and maintained in the presence of transients, which may occur in the background audio also residing in the total audio signal. Several ways in which this can be accomplished are explained in detail.

Adjustment of the Background Noise to Control the PSRA Ratio

Finally, a new invention which monitors the noise in the environment in which the end user is residing will permit the total audio programming, the preferred signal, or the remaining audio signal, to be automatically adjusted in response to increases in ambient room noise. This will prevent the end user from having to continually adjust the audio programming when ambient noise begins to mask the preferred signal.

Delivery of Preferred Signal Separate from the Remaining Audio

As mentioned above, the first segment of these embodiments focuses on step 3 in FIG. 5. Delivering the preferred signal separately from the remaining audio may vary drastically for each media type. Several techniques are disclosed herein for delivering the preferred signal to the end user in a format which it can be separately adjusted with respect to the remaining audio, if desired. It should be noted that each of these embodiments initially assumes that the preferred signal is made available to the delivery format during production of the audio program.

In general, audio programming usually begins with a separate measurement of the preferred signal and is later condensed to a mono or stereo signal before the end user receives it. Many of these embodiments assume that the preferred signal is obtained (step 2) early in the production process, but are not limited to other possible methods for obtaining the preferred signal in post-production.

Prior Art Recording and Delivery Process

Figure 6:
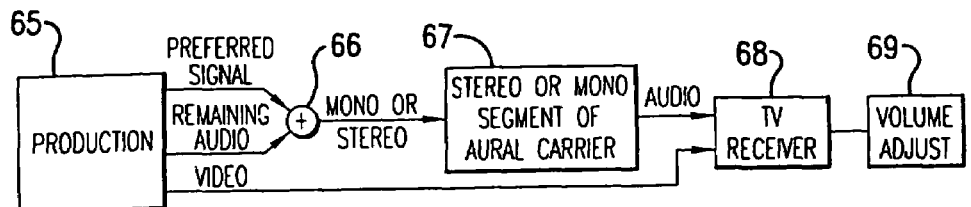
FIG. 6 illustrates a prior art block diagram of the signal paths taken by the audio and video components of a television program before arriving at the end user.

FIG. 6 illustrates a very simplified block diagram of the signal paths taken by the audio and video components of television programming. At some point during the production process 65, the total audio signal originates as a separate measurement of the preferred and the remaining audio signals. Continuing with the "sitcom" example described earlier, the preferred signal is likely to be the actor's voices where all other signals such as music and sound effects are remaining audio.

Early in the production process these signals are mixed by mixer 66 under control of the audio engineer for delivery over a portion of the total aural carrier 67 for a specific television broadcast channel, either over airwaves or cable. This total audio signal along with the video signal is received by the end user at the television 68 where a single gain adjustment mechanism 69 allows the end user to adjust only the volume of the total audio signal. This represents a very simplified version of the prior art process of delivering an audio signal for a television program.

Recording and Delivery Process According to the Present Invention

Figure 7:
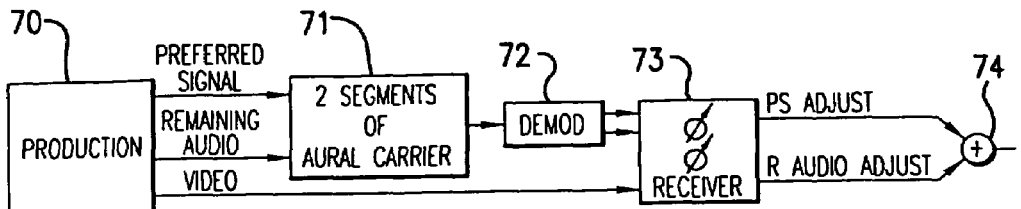
FIG. 7 illustrates an exemplary embodiment according to the present invention that incorporates the ability to transmit two separate audio signals simultaneously.

FIG. 7 illustrates an exemplary embodiment of a process according to the present invention for delivering the preferred signal and the remaining audio in a way that permits the end user to adjust the respective signal levels. In this exemplary embodiment, the mixing of the two audio signals (preferred signal and remaining audio) is not done at the production studio, but rather by the end user on his/her receiver 73. During production, the audio engineer does not combine the preferred signal and remaining audio, but rather sends the two audio signals separately (element 70) on different parts of the total aural carrier (which is created in element 71) in a portion of the bandwidth allocated for each channel to transmit audio. This audio signal is transmitted sent to the television receiver 73, in which the audio signals are demodulated (element 72), sent through separate user adjustable gain components and finally summed 74 to form the total audio signal. This configuration allows the end user to adjust a separated preferred signal component's volume with respect to the remaining audio.

Restoration of the Normal Mix

In the alternative, provisions are made to restore the normal mix for the end users who are currently satisfied with the PSRA ratio. These are described next along with a more detailed description of the total aural carrier in an analog scheme.

The total aural carrier is a 120 kHz bandwidth transmitted on every television channel, intended to contain audio programming which is played in conjunction with the video programming on that channel. Currently, the most common components of the total aural carrier are the mono and stereo segments allocated from baseband to $3f_H$ respectively, where $f_H$ is 15.734 kHz. In addition, centered around $5f_H$ is the secondary audio programming (SAP) channel, which is slightly lower in bandwidth than the mono and stereo channels. Most modern day televisions and VCR's come equipped with an audio decoder that will selected any one of these three audio programs. While some programming is broadcast in stereo, thus utilizing both the mono (50 Hz-12 kHz) and stereo (50 Hz-12 kHz) bandwidths, many television networks currently do not transmit any information on the SAP channel (50 Hz-8 kHz). There are also other segments of the total aural carrier that are not utilized or televisions are not currently equipped with the hardware to decode that segment of the bandwidth. Centered around $6.5f_H$ is the low bandwidth "professional channel" and the segments from $3f_H$ to $4f_H$ and just above and below the professional channel are not specifically allocated.

What this represents in terms of the preferred signal transmission, is that there exists significant unutilized bandwidth in conventional television transmission standards that can accommodate additional signals transmitted in conjunction with the normal audio program.

One exemplary embodiment of the present invention is to send the remaining audio alone in the mono bandwidth while the preferred signal is transmitted in the stereo bandwidth. This is not particularly desirable because it will make the transmission of stereo programming impossible.

Another alternative which retains the stereo signal is to transmit the normal audio stereo programming as originally intended but to transmit the preferred signal on another segment of the total aural carrier, such as the SAP channel. This would require that the television receiver be equipped with a way to simultaneously decode both the stereo and the SAP channels, permit separate gain adjustment on each channel, and add them together. For normal audio programming the user needs only to select the option that mutes the SAP channel or does not decode it at all. The preferred signal audio can also be transmitted on any other segment of the total aural carrier without deviating from the intended invention.

As described above, the transmission of the preferred signal simultaneously with the remaining audio or the total audio program, can allow the end user to adjust the two separately to provide improved listening enjoyment. This cannot be accomplished however, without additional hardware that is not standard in current televisions or VCR's.

For the case where the preferred audio signal is carried on a bandwidth separate from the mono and stereo channels, a more sophisticated demodulator will be required before the gain circuits are applied. Current demodulators will deliver the mono, stereo, or SAP channels separately (where stereo is generated from the subtraction and addition of the mono and stereo channels with appropriate division by two).

ADDITIONAL EMBODIMENT

There is one additional method in which the preferred signal can be delivered to the end user that will provide normal stereo programming for the population, requires only the stereo and mono transmission bandwidths, and still allows relatively pure preferred signal to be delivered to the end user. Since this method can also be performed in all other stereo based media such as CD's, audio tapes, VHS tapes, and radio, it is described in a general sense with possible application to all stereo based media.

Figure 8:
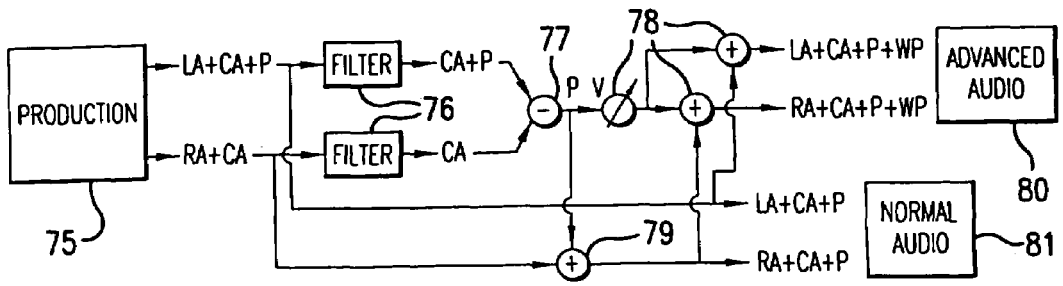
FIG. 8 illustrates the use of a unique stereo mixture from the production process to deliver a relatively pure preferred signal content to the end user without affecting the normal stereophonic audio programming, which can be applied to any media in general, that utilizes stereo programming.

FIG. 8 illustrates one possible way in which the preferred signal can be delivered to the end user utilizing only the stereo left and right channels while still preserving the stereo image. This method still relies on the production method (75) to alter the original stereo mix for delivery of the preferred signal. There are also several assumptions which are made that are generally, but not always true; and are required to be satisfied for this method to work to its full potential. The signals originating from the production 75 of any audio programming are assumed to originate from several different components, one of which is a pure or mostly pure measurement of the preferred signal. (This assumption was also made earlier for the description of television transmission methods for the preferred signal). Another assumption which was inherently made earlier but not explicitly stated was that the preferred signal resides in center audio, that is equally distributed on the left and right channels.

In any of the exemplary embodiments, the voice can easily be panned to either the left or right stereo channel, but the original desires (for the panning of the preferred signal) of the audio engineers and audio production personnel will be lost with these inventions. Finally, the most critical assumption being made for this particular embodiment is that the remaining audio stereo image is predominantly developed outside of the preferred signal bandwidth. For example, if the preferred signal happens to be voice and the remaining audio is special sound effects and music, the frequencies from approximately 200 Hz to 4 kHz (voice bandwidth) of the remaining audio signal are predominantly centered audio and the remaining audio outside those bandwidths can create the stereo image. As long as these conditions are met, the following technique will provide a pure or nearly pure preferred signal to the end user without compromising the stereo image of the normal audio programming.

FIG. 8 begins with the production process 75 where the two stereo signals are delivered to the end user as in FIG. 6. The primary difference here is that the audio engineer pans the preferred signal (P) to either the full right or full left (shown) channel. Then each channel contains equal components of the centered audio (CA) while the left channel also contains strictly left audio (LA) and the right channel contains strictly right audio (RA). After these two signals have been delivered to the end user as a stereo program (CD, audio tape, VHS, television, etc.), several steps follow in order to deliver both the normal and adjusted audio mixtures.

First, each of the produced left and right stereo signals are filtered with bandpass filters 76 intended to remove all content that has not been identified as being in the band containing the preferred signal. Again, for voice this will likely be 200 Hz to 4 kHz. Following the previous assumption, this filtering process will also remove components of both left and right audio channels that are strictly left and right audio, namely RA and LA, leaving only CA and P on the left (shown) or right channel and CA on the right (shown) or left channel. Upon subtraction (adder 77) of these two signals, a separate measurement of the preferred audio signal P remains.

To regain the normal audio program with the preferred audio signal centered, the separate measurement of the preferred audio signal simply needs to be added (at adder 79) back to the right audio signal. The left audio signal will remain unchanged from the original delivery.

To accomplish a user adjusted audio mixture, the preferred signal from the output of adder 77 is modified by a user adjustable gain (W) before being added (adder 78) to the left and right normal audio programming to form a centered preferred signal which can be modified by the end user. The adjusted audio 80 is thus available as the outputs of adders 78, whereas the normal or unadjusted audio 81 is available at the output of adder 79 and the original left audio channel.

Less than Infinite Panning

With the method described above, several assumptions were emphasized. One of these assumptions can be accounted for and relaxed with some modification to the above process. Information about the stereophonic location of the preferred signal can be retained if the amount of panning of the preferred signal is a known value that is less than infinite. In the above discussion, the preferred signal was panned 100% to one channel during the production process, allowing the filtered subtraction to produce a nearly pure preferred signal. If it is known and established early in the recording and delivery process that the preferred signal will be panned to one channel by some finite ratio of left to right (or right to left), then the stereo image of the preferred signal can be reconstructed in the delivery process.

For example, suppose the desired original programming has a preferred signal with an image that is 20 dB on the left channel and 18 dB on the right channel. If a standard is established that instructs audio engineers to pan the preferred signal to the left exactly 10 dB, the new image is 30 dB on the right and 8 dB on the left. Subtracting these new channels results in a 22 dB preferred voice signal. This is then automatically adjusted to a level of 10 dB, a certain voltage level that can be easily referenced if such a standard is put into practice. Now, the 10 dB preferred signal is subtracted from the left channel and added to the right to restore the original desired stereo image. A similar process is used to create the same stereo image for the adjusted audio mixture.

The above can be applied to any media utilizing stereophonic sound which originates from multiple measurements of the programming, one including a relative pure measurement of the preferred signal. These media may include CD's, VHS tapes, radio, and television to name a few.

Having covered some components for delivery of the preferred signal for certain audio media, several more generalized aspects of the present invention are described next which can be used on any platform supporting the preferred signal to remaining audio user adjusted mixture. There are three separate aspects of the present invention that are described which provide the end user with the ability have more control over the PSRA mix, the behavior of the total audio programming in the face of transients, and the audio programming with respect to ambient noise in the listening environment. Without loss of generality, each of the aspects of the present invention can be coupled together and used in conjunction with one another as well as with any of the delivery methods described above. In fact, as long as a preferred signal and remaining audio exists, any of the following exemplary embodiments can be implemented to provide improvement in listening quality above and beyond simple volume adjustment.

Frequency Dependent Gain Adjustment to PSRA

One of the original goals of providing the end user with a preferred signal audio which is separate but in conjunction with the remaining audio program, was to allow the hearing impaired to improve their understanding of speech or other preferred signal programming. While adjusting the overall volume level of the preferred signal with respect to the volume level of the remaining audio will improve intelligibility and enjoyment for the hearing impaired (as well as the normal hearing population), it is not sufficient for many types of hearing impairment. One aspect of the present invention seeks to improve upon simple gain adjustment of the preferred signal to remaining audio by introducing a frequency dependent gain mechanism that is user controlled to amplify or suppress certain frequency components of either the preferred signal or remaining audio.

Figure 9:
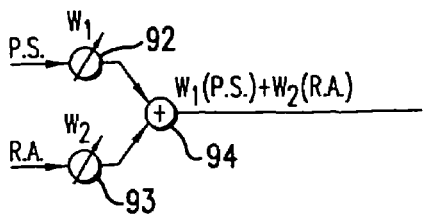
FIG. 9 illustrates an exemplary gain adjustment embodiment according to the present invention for the preferred signal versus remaining audio.

FIG. 9 illustrates an exemplary embodiment utilizing only straight gain mechanisms. The preferred signal (PS) is passed through a user adjustable gain circuit 92 and added by adder 94 to the remaining audio signal which has been amplified by a separately adjustable user gain element 93. Undoubtedly this format will provide the end user with more flexibility than is currently available in standard audio electronics.

However, the hearing impaired listener (who stands to benefit from this technology) may be somewhat disappointed in the apparent improvements. Most hearing impairments occur first in the high frequency ranges, typically above 2 kHz. Taking, for example, speech as the preferred signal; speech intelligibility is most affected by the speech frequencies above 2 kHz. If the hearing impairment of the listener resembles a low pass filter (as many do) simply raising the gain of the speech may not improve speech intelligibility because the low frequencies are now so loud that they are not enjoyable.

The most effective way to compensate for this limitation in gain adjustment, is frequency dependent gain adjustment. If the end user could specify the frequency region where added volume is required, the sound could be tailored much more specifically to the hearing impairment.

Figure 10:
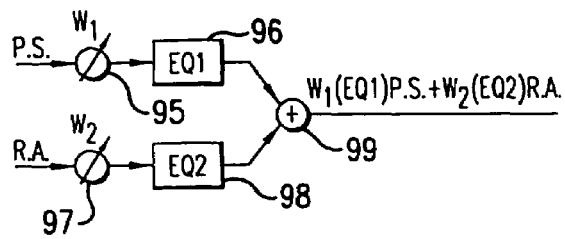
FIG. 10 illustrates inclusion of an equalization process into a gain adjustment to create a frequency dependent gain according to one aspect of the present invention.

FIG. 10 illustrates the inclusion of such a frequency dependent gain device 96 on the preferred signal and on the remaining audio 98. The resulting total audio signal output from adder 99 is a combination of the preferred signal and remaining audio where each signal has been independently gained and "equalized."

Equalization refers to on method of frequency dependent gain, similar to that which is used on many stereo systems. The most elementary of equalizations modify the bass (low frequencies) and treble (high frequencies) with a single knob. More sophisticated equalizers have bandpass filters for every octave band from 20 Hz to 20 kHz, each having a user adjustable gain.

The unique nature of this aspect of the present invention is that the preferred signal can be equalized separately from all other remaining audio, whereas conventional equalization only modifies the total audio signal. One beneficial application of equalization of a pure voice preferred signal can be realized by raising the higher frequencies of the voice and lowering the high frequencies of the remaining audio to improve speech intelligibility, without raising the low frequency levels to a point that is uncomfortable. The frequency dependent gain components (96 and 98) can be realized in many possible ways, as would be apparent to those skilled in the art, and are not discussed in detail herein.

Adjustment in the Face of Transients

Most audio programming is transient in nature; that is, the loudness increases or decreases readily over time. An analogy is made to the programming of a football game where as the home team approaches the goal line the crowds excitement grows as does the loudness of their cheering. During the radio broadcast of such a game, the crowd noise sometimes masks the announcer's voices. However, this usually only lasts a few moments and the mixture of crowd to announcer is back to the originally intended programming, suitable for most listeners. The present invention described herein assumes that the preferred signal (announcer's voice in this case) is available as a separate component from the remaining audio (crowd noise).

If this is the case, one additional aspect of the present invention for correcting for transient changes in either the preferred signal or remaining audio programming can maintain the user selected gain ratio between the two signals throughout the entire program, thus ensuring that the end user does not have to continually adjust the two volume levels in the presence of momentary swells in either signal. There are several ways to accomplish this goal that are described next.

Soft Clipping Circuit

FIG. 11 illustrates one technique for automatically maintaining the user selected ratio of preferred signal to remaining audio, even in the presence of transient changes in either program. Before the preferred signal or remaining audio is delivered to the gain adjustment mechanisms (32, 33), each signal is sent through a soft clipping circuit or algorithm 30, 31. As before, the outputs of the gain adjustment mechanisms is added at adder 34 and output to the end user as total audio=$w_1 PS+w_2 RA$.

Soft clipping refers to the ability to limit the overall magnitude of a signal when its level is too high, without introducing any higher frequency artifacts. This is sometimes referred to as companding as is well documented in its usage and possible implementations. This technique implemented in the context of automatically fixing the user adjusted PSRA ratio, can be thought of as a two channel companding (or soft-clipping) circuit with the ability to control the relative levels of the two limited signals. The outputs of each of the two limiters (30, 31) can be considered as normalized versions of their inputs based on some preset parameter from the soft clipping circuit. Soft clipping can be accomplished in a variety of ways with parameters that can be programmed into the circuit or algorithm. It may also be appropriate to offer the end user with the ability to adjust some of these parameters to his/her own hearing needs.

Limiting Algorithm

Consider one exemplary embodiment of a limiting algorithm as shown in FIG. 13. The input signal is collected over time and a vector (string of input samples) is collected and temporarily stored in storage 35. Once the vector has been filled with input samples, it is delivered to an algorithm 36, which may determine the peak signal value, the RMS of the vector, or some other function of signal amplitude (which could also be a function of frequency) that is then used to alter the input signal by simple division by divider 37. The resulting signal is in a sense limited by the amplitude of the original input signal.

There are at least two parameters in such an algorithm that may be of interest for the user to control. The vector size 37 used to generate the amplitude measure is a selectable quantity. For large sizes the delay between the amplitude factor 36 and the actual modified input signal may become quite large and cause the effects of the limiting to be delayed and in some cases not apparent. However, smaller sizes of the vector may not provide an accurate representation for the total input signal, causing wide variations in the amplitude factor 36 and resulting in wide amplitude variations which may be unpleasant to listen to.

The method in which the amplitude factor is determined is also a parameter that affects the end user's enjoyment of the program. Selecting a maximum value of the vector will drastically lower the overall level of the input signal in the presence of very fast transient signals, and may lower the amplitude of other signals in the audio that need to be heard immediately following such a transient. Selecting the RMS level of the vector may also not provide enough attenuation of the loud transients to make a perceivable difference. It is likely that the choice of the peak detection algorithm will be program and user dependent. So these parameters may be preset or given as user selectable components for both the preferred audio signal and the remaining audio signal.

Once the two signals have been limited, their relative levels will remain constant even in the presence of transient signals. Now the end user can apply separate gain (32, 33) to each of the two limited signals to achieve the desired mixture between the preferred signal and remaining audio. Transient surges in either signal will be eliminated by the limiting circuit without affecting the user selected adjustment of the relative signal levels.

Additional Embodiment of Transient Suppression

Another method for accomplishing this same goal of maintaining the user selected ratio of preferred signal to remaining audio in the presence of transient signals, is presented in FIG. 12. This method offers additional flexibility and will support a more realistic reproduction of volume changes in either the preferred signal or the remaining audio.

First, each signal is passed through its own volume adjustment (38, 39) as selected by the user during any point in the programming. Each signal is then amplified accordingly and sent to vector accumulators (41, 42). The gain adjustment values (38, 39) selected by the user are then used to generate a single number ratio that represents the user selected preferred signal volume to the user selected remaining audio volume (PSRA ratio).

Now, once the vector accumulators are full, an algorithm similar to (36) realized as a peak detector, RMS calculator, etc. (48, 49), computes the appropriate value that represents in some form, a transient amplitude of the vector segment. The values for each of the two signals are then used to make a ratio (43) that represents the actual level of the preferred signal with respect to the remaining audio after the user has adjusted the levels.

The user selected ratio and the actual ratio are compared by division (44). If they are the same (as desired) the result is unity and the preferred signal is not modified by the multiplication operation (45). However, if the actual ratio is greater than then desired ratio, the result of (44) will be less than unity (perhaps very small). If the preferred signal is multiplied by a very small number, the volume is greatly reduced thus defeating the purpose of the entire user adjustment operation. It is recognized that this may not be desirable in programs that have very little or no remaining audio, such as news programming.

One way to compensate for this problem is to ensure that the result of (44) is never less than unity, thus only responding to increases in the remaining audio volume. Another way to handle this issue is to modify the remaining audio signal instead of the preferred signal. Eliminating the multiplication (45) of the preferred signal and adding an inverse operator (46) and multiplication operation (47) to the remaining audio signal accomplished this goal. Now, for increases in the transient signal above the user desired ratio established with (38) and (39), the system will decrease the amplitude of the remaining audio signal to maintain the desired ratio. Again, precautions must be taken for this configuration so that increases in the preferred signal do not cause the transient level to become too loud. Also the parameters for selecting vector size and determination of amplitude method may be provided to the end user for a large amount of flexibility in tailoring the audio programming.

Additional Embodiment for Transient Suppression

A final embodiment for automatically maintaining the user selected ratio in the presence of transients in either the preferred or remaining audio signals is seen in the form of equalization. Coupling the previously described innovations for frequency weighted gaining of the preferred signal separate from the remaining audio signal with the automatic PSRA ratio hold function, results in a system that can maintain different ratios of preferred signal to remaining audio at different frequencies. So in effect, the user selected frequency dependent gain may be at different ratios for different frequency bands and the automatic PSRA hold function will be operating separately at each of those frequency bandwidths.

The implementation of this is realized simply as a bank of systems such as the one shown in FIG. 12, that are each assigned to a different frequency band, and each of the gains (38) and (39) represent frequency dependent gains that operate only on a segment of the total audio bandwidth for each of the preferred signal and remaining audio signals.

Ambient Noise Adjustment

Another aspect of the present invention pertains to overall programming levels for enjoyment in ambient noise environments. All previous embodiments have focused on raising the preferred audio level over the remaining audio which is present in the total audio program that is initially delivered to the end user. This does not address the environment where the end user is attempting to enjoy the programming.

In steady state ambient noise fields, the user can simply increase the volume of the programming to avoid masking that may be occurring from noise present in his/her listening environment. However, often transient noises require the user to continually adjust the volume of the audio up and down in order to compensate for such noises.

This aspect of the present invention automates the process of manually adjusting audio programming to compensate for ambient noises present in the listening environment. The process requires that an independent measure of the ambient noise in the listening environment be made simultaneously with the audio programming. The reason this becomes a difficult prospect is because the audio programming itself contributes to the overall ambient noise level in the listening environment.

There are well established methods for extracting components of signals given certain information about the system. The measurement means used for determining the ambient noise in a listening environment can take the form of any acousto-electric transducer, such as a microphone. For the system described herein, it will be assumed that the microphone is placed in front of the electro-acoustic actuator means that is supplying the audio programming to the listening environment.

This system is shown in FIG. 14. The speaker 151 represents the electro-acoustic actuator which is placed near the microphone 152 measuring the ambient noise in the room.

The first step in obtaining a clean measurement of the ambient noise, requires that the dynamics existing from the speaker 151 to the microphone 152 (all inclusive) be accurately identified by system identifier 150. There are many algorithmic methods available for system identification including the LMS algorithm utilizing an FIR adaptive filter. System identification is a requirement for the performance of the room audio monitoring system to be effective. Once the physical system has been approximated digitally, it is stored as a filter, $G_{est}$.

FIG. 15 illustrates the entire system for adjusting the volume of the audio programming in response to ambient noise present in the listening environment. The block 158 represents the ambient noise source in the listening environment monitored by the microphone 157. First, the audio programming is filtered through $G_{est}$ 153 to produce the approximate audio signal contribution from the audio programming only, which is measured by the microphone 157. The microphone measurement includes both the ambient noise and the audio signal which is generated from the speaker and travels through the air to the microphone 157.

To obtain a clean measure of the ambient noise in the environment, the components of the audio signal generated by the speaker are removed by adder 154. This only represents an approximation of the ambient noise signal and is limited by the accuracy of the system identification. Now, the approximation of the audio programming components that are reaching the microphone 157 and thus the end user, are divided by the approximation of the ambient noise levels by divider 155 to achieve a ratio which represents an approximation of the actual volume of the audio programming with respect to the ambient noise measured in the listening environment.

Initially, the user has selected an overall volume of the entire audio program (which could also be the volume of either the preferred signal, the remaining audio, or the total audio volume control) which is the desired volume level with respect to the ambient noise in the room at the time of initial adjustment. This value is then divided by the approximation of the actual volume ratio of the audio programming to the ambient noise in the room to resulting a single number which represents the difference in the desired volume level with the approximated actual volume level. This ratio is then used to control the mixer 159, which outputs the actual audio signal until the desired ratio matches the actual ratio. It is advisable that this algorithm be performed as an average over time, such as the vector elements presented earlier. This will make the changes in volume more pleasant and gradual. The length of time that the vector covers may also become a user adjustable parameter.

There are no limitations on the use of this embodiment of the present invention in conjunction with the previously described embodiments. In fact, a completely user adjustable audio system will likely include each of these components used in conjunction with each other.

User Control of Companding for Each Signal

The previous paragraphs discussed in detail several methods for maintaining the user selected VRA in the face of transients in either the voice or the remaining audio signal. Another key idea related to the idea of maintaining the user selected VRA in the face of audio transients, is that of allowing the user to adjust the amount of companding (soft clipping, or limiting) that occurs on each signal. This particular adjustment mechanism will allow the user to maintain a specific improvement in the voice to remaining audio adjustment while also experiencing a varying amount of dynamic range adjustment on either (or both) of the voice or remaining audio signals.

Figure 16:
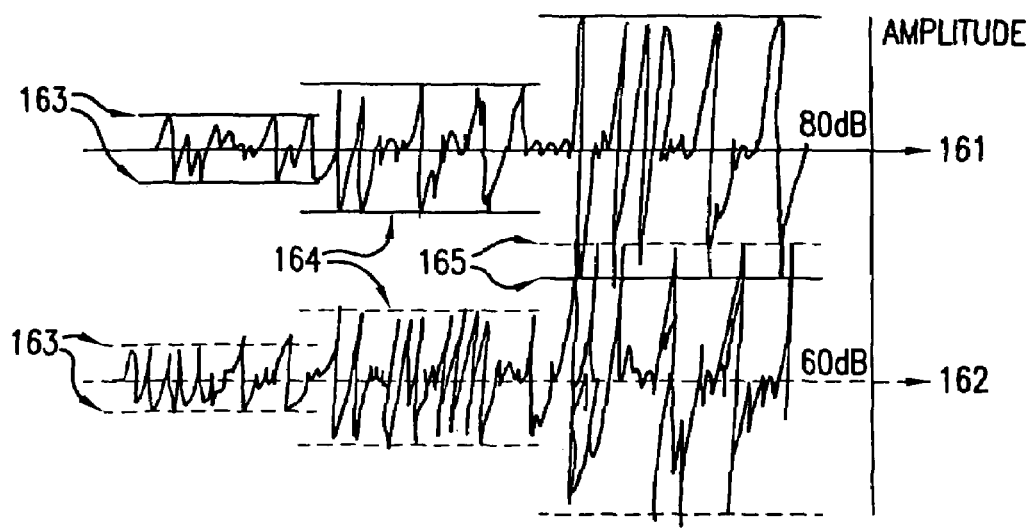
FIG. 16 illustrates the concept according to the present invention of controlling the companding in terms of the amplitudes of the time trace signals for voice and remaining audio, termed the dynamic amplitude range (DAR).

FIG. 16 illustrates this concept in terms of the amplitudes of the time trace signals for voice 161 and remaining audio 162, termed the dynamic amplitude range (DAR). Suppose the user adjusts the voice level 161 to a mean value of 80 dB while the mean value of the remaining audio is at 60 dB 162. Three different levels of companding are shown from left to right for each signal since either or both signals can experience compression.

If a high amount of compression is applied to both signals as in 163, the DAR of both the voice and the remaining audio (loud louds and soft softs) will be very compact. To achieve a more realistic response to variations in amplitude response the listener can adjust the DAR levels of both signals as in 164 or 165.

In the last case 165, it is clear that some of the remaining audio amplitude shown by the dotted line will interfere with the high amplitude voices. This case may happen when someone is trying to yell over a gunshot or loud train. Clearly this provides a more realistic performance but may be objectionable for those hard of hearing.

As each signal's DAR can be adjusted independently, the user may also select a narrow DAR for the voice along with a wide DAR for the remaining audio, while the mean levels (also set by the user) are maintained throughout the program.

Additional Embodiment for Transient Suppression

Another method for accomplishing the goal of maintaining the user selected VRA ratio through transients, is to automatically adjust the mean signal power levels (SPL) levels of the signals when the remaining audio or voice becomes too loud to maintain the user selected ratio.

Figure 17:
FIG. 17 shows an approximate moving average of voice (solid) and background audio (dotted), in which the average volume of the remaining audio frequently exceeds the average volume of the voice, making dialog difficult to understand.

Referring to FIG. 17, first consider an approximate moving average of voice (solid) 171 and background audio (dotted) 172. The average volume of the remaining audio frequently exceeds the average volume of the voice, making dialog difficult to understand. In an effort to achieve some improvement in intelligibility, the user selects a VRA during a passage when the voice is fairly loud with respect to the remaining audio, and he thinks he's achieved his goal.

Figure 18:
FIG. 18 illustrates the effect on an adjustment on the signals depicted in FIG. 17, even though the VRA has been corrected during some segments of the program, other sections of the remaining audio are still too loud due to transients.

FIG. 18 illustrates such an adjustment using the same two signals, i.e., the preferred signal (or voice) 181 and the remaining audio (or background) 182. Even though the VRA has been corrected during some segments of the program, other sections of the remaining audio are still too loud due to transients. Additional lowering of the remaining audio (increasing VRA) will cause the sections of the remaining audio that are soft to be completely imperceivable in the presence of dialog (or even due to the dynamic range of the D/A hardware).

To solve this problem, only sections of the remaining audio (or voice) that are too loud (or too soft) will be attenuated (or amplified) in order to maintain the VRA set by the user at any given moment in the programming.

Figure 19:
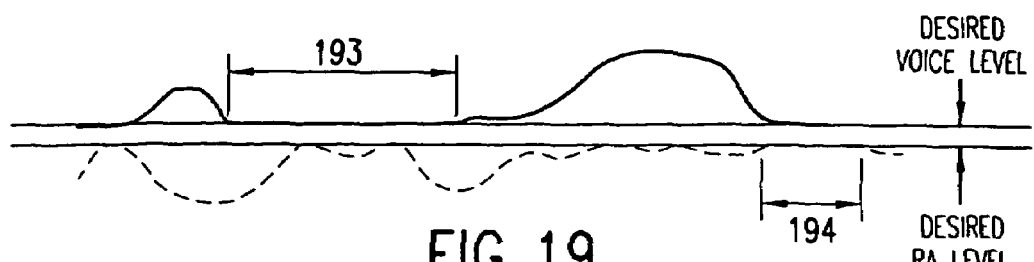
FIG. 19 shows the sections where such an auto-leveling process would work on the same signals depicted in FIGS. 17-18, in which it is shown how some average DAR is retained in the signals.

FIG. 19 shows the sections where such an auto-leveling process would work on the same signals discussed above. Section 193 represents the time during which the voice was raised to maintain the VRA at a minimum of what was requested initially by the user. Section 194 illustrates the section where the remaining audio was attenuated to maintain a minimum VRA. Either or both of the adjustments can be automated to ensure that the user maintains (as a minimum) the VRA set at any point in time.

Additionally, FIG. 19 illustrates how some average DAR is retained in the signals. Recall that the average deviation of these signals can be limited on both amplitude levels so that either or neither signal has very limited DAR.

Associated Audio Mode VRA Adjustment

Recall that there are Main, Associated, and Multi-lingual services provided for by the ATSC standard. There are two main services (complete main (CM), and music and effects (ME)) that are typically 5.1 channels, and many associated services (dialog (D), hearing impaired (HI), etc.) that are typically 1 channel. The multi-lingual services could be achieved by providing a multi-channel music and effects service (that does not contain dialog) in conjunction with a dialog (D) associated service that is reproduced primarily on the center channel. These two audio services would be played simultaneously to constitute an entire program. The dialog service can then be changed by the end user to adjust the language (French. Spanish, etc.) without affecting the original music and effects. If the ME channel is transmitted as a 5.1 channel program, the dialog is sent as a single channel reproduced on the center channel, only without any spatial positioning capability.

Some producers may be bothered by this; therefore a second method for transmitting is to provide both the ME and D as 2-channel stereo audio allowing L-R positioning of both the remaining audio and dialog. Currently, it seems that the use of the dialog associated service is NOT the manner in which multiple languages are delivered to the end user. Therefore, these aspects of the present invention described next are envisioned for the time when the associated services are utilized. This will likely occur on future digital television broadcasts before DVD, since space is of less concern on DVD's.

These aspects of the present invention take advantage of the dialogue mode (or any of the associated audio services) by extracting the associated service from the main service before they are mixed in the decoder. The digital audio decoder decodes the bitstream that contains both the main and associated service. (The user typically selects which, if any, associated service besides dialog is desired, i.e., commentary, voice over, etc., and also selects the language in which the program will be viewed. This information is all contained in the AC-3 bitstream as metadata).

Once the decoder has uncompressed the audio signals, extracted the metadata, and read the user inputs mentioned above, the hardware selects the appropriate audio bitstreams and mixes them together to form a total audio program. These channels are then either given to the user as 5.1 channels, or downmixed to fewer channels for systems having fewer speakers. This aspect of the present invention will take the main audio and associated audio (dialog service, hearing impaired service, visual impaired service, etc.) before they are mixed, and apply adjustable gains to each of them. This adjustability will be directly available to the user who can lower or raise the relative level of either the voice or remaining audio. Any spatial information is retained that was present just before the mix. In addition, since the adjustment is performed before the downmix, the user who has fewer than 5.1 channels can still take full advantage of the adjustability, while the user with 5.1 channels can adjust the relative level of the dialog on the center channel with respect to other audio on the center channel if necessary.

As the dialog associated service (and other associated services) described in A/54 might provide the voice separate from the remaining audio all the way to the end user. However, the way decoders are designed, these two signals are mixed together in the consumer electronic hardware (set-top box, DVD player, DTV, any DD decoder) before the signals reach the audio system. Any overall level or frequency dependent level adjustment should also be considered as part of this invention for any of the associated services. The dialog service offers a particular benefit to international products since the dialog mode is the mode that is intended to support the multi-language capability. In addition, the dialog mode contains speech that is not pre-processed by the producer (which may be objectionable to those of normal hearing). Therefore, the dialog level adjustment capability will offer the normal listener the ability to adjust the overall level whereas the hearing impaired listener may have the opportunity to apply user specific processing to the normal voice, which is unavailable when using the hearing impaired mode as described in the ATSC document A/54.

In addition, any VRA type adjustment done using both the associated service and the main audio services described above can be used in conjunction with the VRA-hold devices mentioned above. This automated capability is new to any relative level adjustment, including what is implied by the HI mode (i.e., there are no provisions for maintaining any of the user adjustments in the presence of transients of either signal.) Therefore, this aspect of the present invention allows: 1) main and associated audio service relative level adjustment, i.e., VRA (for those services that don't already employ such capabilities); and 2) a VRA-HOLD device, in such a unique way that it can be easily built into existing decoder designs without compromising the bitstream or requiring any additional metadata or bandwidth.

Figure 20:
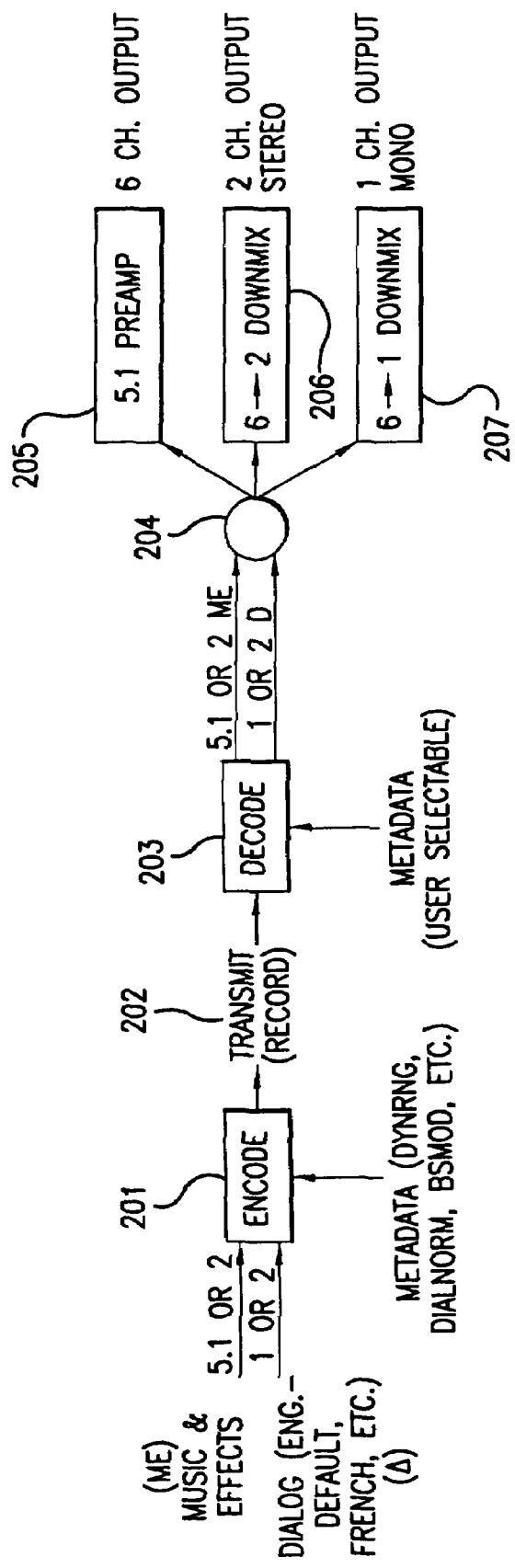
FIG. 20 represents the way audio is currently designed to be transmitted to the end user on DVD using the dialog mode and the multi-language services.

Block diagrams of the hardware and software components for this aspect of the present invention are depicted in FIG. 20, which shows how the D and ME channels are delivered to the end user having: 5.1 speakers (output of 205), 2 speakers (output of 206), or one speaker (output of 207).

FIG. 20 represents the way audio is currently designed to be transmitted to the end user on DVD using the dialog mode and the multi-language services. DVD players or digital television broadcasts that have the capability to transmit multiple languages, permit the user to select the desired language through metadata adjustments. The decoding, metadata and mixing all takes place inside the chip hardware, either as part of the decoder itself or as an integrated circuit that is also part of the decoder chip or as a separate component. (The former is the most likely and least expensive). The user does not have access to the dialog signal in the current design because it was not envisioned to be necessary.

Figure 21:
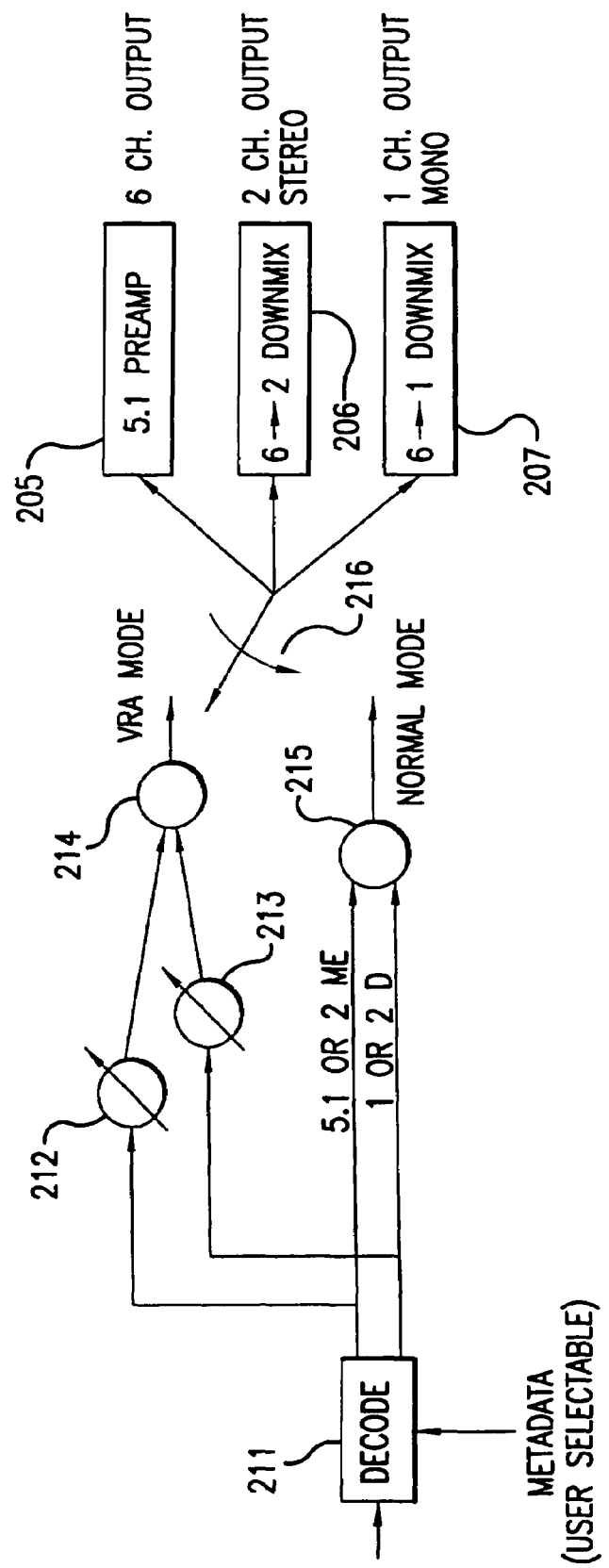
FIG. 21 depicts the decoder components that perform the adding, as altered according to the present invention.

According to the present invention, the decoder components that perform the adding, be slightly altered as shown in FIG. 21. After the bitstream is decoded by decoder 211 and the appropriate metadata is applied (including the user selectable language), the normal mode is as appears in FIG. 20, where the associated and main audio services are mixed together (output of 215).

The difference now is that before the mixing occurs, the same two signals are also sent directly to two (or one that controls both) variable gain elements 212, 213 that are user controllable. The sum 214 of the adjusted dialog and remaining audio are delivered and downmixed to any number of speakers as before. The user will also have the ability (either through metadata or a switch) to toggle between the adjusted mode and the normal mode via switch 216.

Another unique aspect of the present invention is that it ultimately reduces the required bandwidth for providing the end user (hearing impaired or otherwise) the capability to adjust the dialog signal (in any language) in such a way that intelligibility is optimized for that particular user. Currently, the vision is to transport a hearing impaired dialog signal that has been "processed for improved intelligibility" (via A/54) via the HI mode, in conjunction with the dialog mode (which is a separate associated audio service) containing multiple languages.

If the hearing impaired listener wants to hear the enhanced dialog in another language, it may not be possible unless yet another HI mode language is sent. Therefore, the current embodiment may require four different dialog services to satisfy users for two languages (for example) including: normal dialog English, normal dialog French, hearing impaired mode English, and hearing impaired mode French.

The present invention reduces this required bandwidth by half and offers more functionality to a wider range of users! By sending only the dialog mode (French and English) and breaking the two signals (as shown above in the "VRA mode") before they are combined in the decoder, the ability to adjust the level and apply any post processing for the hearing impaired is available. As the processing can be done at the convenience of the end user, it can be tailored to the most desirable processing for that individual, and not what the producer thinks is required.

Finally, breaking the dialog out of the decoder before it is combined with the main service allows the dialog to be transmitted to a hearing impaired listener directly, without interfering with the viewing of those with normal hearing. This would typically be accomplished via headphones (or via infrared or other wireless means for sending the signal directly to a hearing aid being worn by a hearing impaired listener) where the processed dialog is sent directly to the hearing impaired individual and the normal dialog is sent to the normal hearing listener through the air or another set of headphones.

Ultimately, this aspect of the present invention provides: 1) improved VRA adjustability and truly personalized hearing enhancement for the hearing impaired; 2) broader international audience via the dialog mode; 3) reduced bandwidth for transmission of digital audio; and 4) a method for accomplishing this without modifying the AC-3 bitstream, without adding additional metadata, and without hindering or changing any component of the encoding or decoding process as is stated in the standards today.

Within the present invention are many other possible embodiments; only a few of which are mentioned here. This adjustment capability should not be limited to strictly volume, but can include frequency shaping as well. In addition, we've primarily discussed using this adjustment feature with the dialog service. This capability can be made available on any of the associated services just as easily.

Moreover, the prior discussion has only focused on adjustments in terms of Dolby digital audio. These same ideas can be applied to any similar audio format, including but not limited to: DTS, SDDS, THX, MPEG, Dolby E, etc.

Center Channel Voice Adjustment

Audiophiles with "high-end" equipment including multi-channel amplifiers and six-speaker systems, currently have a limited capability to adjust the volume on the center channel independently of the audio on the other five speakers. Since many movies have mostly dialog on the center channel and other sound effects located on other channels, this limited adjustment capability allows the user to raise the amplitude of the mostly dialog audio so that it is more intelligible during sections with loud sound effects. Currently, this limited adjustment has two important shortcomings and this aspect of the present invention provides solutions to those limitations. The shortcomings are: It is an adjustment capability that is only available to the consumers that have a DVD player and a six-speaker home theater system that permits volume level adjustment of all speakers independently; It is an adjustment that is will need to be continuously modified during transients in voice (center channel) and remaining audio (all other channels); and VRA adjustments that were acceptable during one audio segment may not be good for another audio segment if the remaining audio level increases too much or the dialog level reduces too much.

It is a fact that a large majority of consumers do not and will not have a home theater that permits this adjustment capability, i.e., Dolby Digital decoder, six-channel variable gain amplifier and multi-speaker system for many years. In addition, no consumer will have the ability to ensure that the VRA ratio selected will stay the same for an entire program, until using the present invention.

Figure 22:
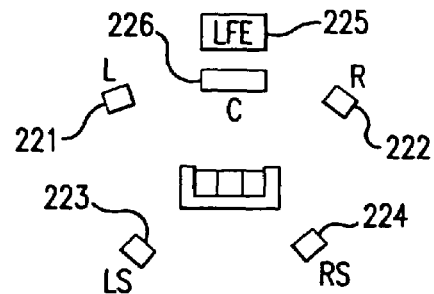
FIG. 22 illustrates the intended spatial positioning setup of a common home theater system.

FIG. 22 illustrates the intended spatial positioning setup of a common home theater system. Although there are no written rules for audio production in 5.1 spatial channels, there are industry standards. One of these standards is to locate the majority of dialog on the center channel 226. Likewise other sound effects that require spatial positioning will be placed on any of the other four speakers labeled L 221, R 222, Ls 223, and Rs 224 for left, right, left surround and right surround. In addition, to avoid damage to midrange speakers, low frequency effects LFE 225 are placed on the 0.1 channel directed toward a subwoofer speaker.

Digital audio compression allows the producer to provide the user with a greater dynamic range for the audio that was possible through analog transmission. This greater dynamic range causes most dialog to sound too low in the presence of some very loud sound effects. The following example provides an explanation. Suppose an analog transmission (or recording) has the capability to transmit dynamic range amplitudes up to 95 dB and dialog is typically recorded at 80 dB. Loud segments of remaining audio may obscure the dialog when that remaining audio reaches the upper limit while someone is speaking. However, this situation is exacerbated when digital audio compression allows a dynamic range up to 105 dB. Clearly, the dialog will remain at the same level (80 dB) with respect to other sounds, only now the loud remaining audio can be more realistically reproduced in terms of its amplitude. User complaints that dialog levels have been recorded too low on DVD's are very common. In fact, the dialog IS at the proper level and is more appropriate and realistic than what exists for analog recordings with limited dynamic range.

Even for consumers who currently have properly calibrated home theater systems, dialog is frequently masked by the loud remaining audio sections in many DVD movies produced today. A small group of consumers are able to find some improvement in intelligibility by increasing the volume of the center channel and/or decreasing the volume of all of the other channels. However, this fixed adjustment is only acceptable for certain audio passages and it disrupts the levels from the proper calibration. The speaker levels are typically calibrated to produce certain SPL's in the viewing location. This proper calibration ensures that the viewing is as realistic as possible. Unfortunately this means that loud sounds are reproduced very loud (see dynamic range discussion above). During late night viewing, this may not be desirable. However, any adjustment of the speaker levels will disrupt the calibration. The following invention will remedy this situation for both normal (calibrated) viewing and late night (VRA) viewing.

Automatic VRA Adjustment Feature for Center Channel

Some gain of the center channel level or reduction of the remaining speaker levels provides improvement in speech intelligibility for those consumers that have a 5.1 channel audio system that has that adjustment capability. Note that all consumers do not have such a system, and the present invention allows all consumers to have that capability.

Figure 23:
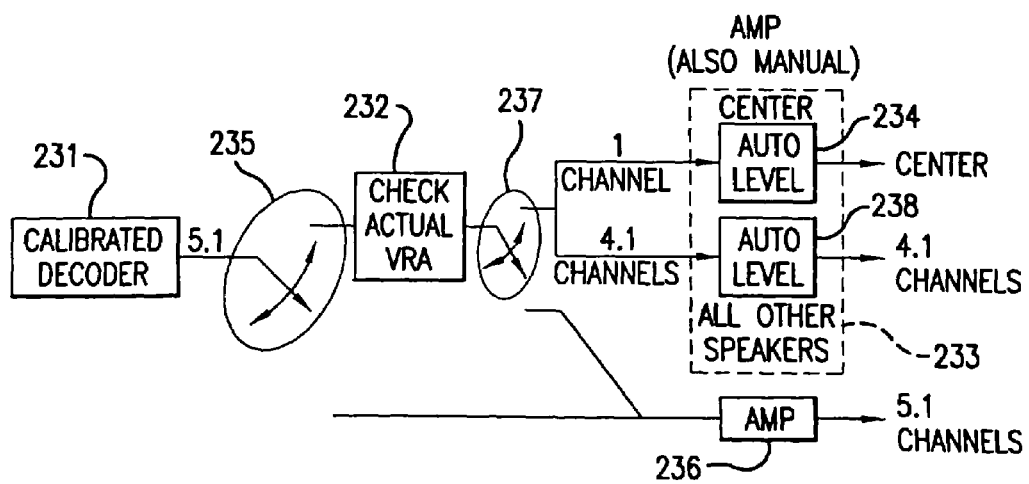
FIG. 23 illustrates a system where the user has the option to select the automatic VRA leveling feature or the calibrated audio feature according to the present invention.

FIG. 23 illustrates a system where the user has the option to select the automatic VRA leveling feature or the calibrated audio feature. The system is calibrated by moving the switch to the lower position which would be considered the normal operating position where all 5.1 decoder output channels go directly to the 5.1 speaker inputs via a power amplifier (which could be integrated).

The decoder would then be calibrated so that the speaker levels were appropriate for the home theater system. As mentioned earlier these speaker levels may not be appropriate for nighttime viewing.

Therefore a second option (upper switch position in FIG. 23) is made available through this aspect of the present invention, that allows the consumer to select a desired VRA ratio and have it automatically maintained by adjusting the relative levels of the center channel with respect to the levels of the other audio channels.

During segments of the audio program that don't violate the user selected VRA, the speakers reproduce audio in the original calibrated format. The auto-leveling feature only "kicks-in" when the remaining audio becomes too loud or the voice becomes too soft. During these moments, the voice level can be raised, the remaining audio can be lowered, or a combination of both. This is accomplished by the "check actual VRA" block 232 in FIG. 23. If the user selects to have the auto VRA hold feature enabled via switch 235, then the 5.1 channels levels are compared in the check actual VRA block 232. If the average center level is at a sufficient ratio to that of the other channels (which could all be reverse calibrated to match room acoustics and predicted SPL at the viewing location) then the normal calibrated level is reproduced through the amplifier 236 via fast switch 237.

If the ratio is predicted to be objectionable then the fast switch 237 will deliver the center channel to its own auto-level adjustment and all other speakers to their own auto level adjustment. As mentioned earlier, the previous section discussed these adjustment possibilities in terms of FIGS. 16-19 in detail. Any of those aspects of the present invention can also be applied to the 5.1 center/other speaker level adjustments as shown in FIG. 23.

According to the present invention: 1) those auto VRA-HOLD features are applied directly to the existing 5.1 audio channels; 2) the center level that is currently adjustable in home theaters can be adjusted to a specific ratio with respect to the remaining channels and maintained in the presence of transients; 3) the calibrated levels are reproduced when the user selected VRA is not violated and are auto leveled when it is, thereby reproducing the audio in a more realistic manner, but still adapting to transient changes by temporarily changing the calibration; and 4) allowing the user to select the auto (or manual) VRA or the calibrated system, thereby eliminating the need for recalibration after center channel adjustment. [note to add variability]

Also note that although the levels are said to be automatically adjusted, that feature can also be disabled to provide a simple manual gain adjustment as shown in FIG. 23.

Center Channel Adjustment for Downmix to Non-Center Channel Speaker Arrangements Many consumers do not have and will not have home theater systems for quite some time. However, DVD players are becoming more popular and digital television will be broadcast in the near future. These digital audio formats will require the end user to have a 5.1 channel decoder in order to listen to any broadcast audio, however, they may not have the luxury of buying a fully adjustable and calibrated home theater system with 5.1 audio channels.

The next aspect of the present invention takes advantage of the fact that producers will be delivering 5.1 channels of audio to consumers who may not have full reproduction capability, while still allowing them to adjust the voice to remaining audio VRA ratio level. In addition, this aspect of the present invention is enhanced by allowing the user to choose features that will maintain or hold that ratio without having a six speaker adjustable system.

This can be realized by means of an interfacing unit that receives a DD bitstream from the output port of a DVD player, so another similar device, and then provides a means for adjusting the center channel level, according to a user-selected VRA, a customized audio decoder, followed by a downmix of the signals to stereo, four-channel, or any other speaker arrangement that does not provide a center channel speaker.

FIG. 24 illustrates one conceptual diagram of how this downmix would be implemented.

FIG. 25 shows that this capability could be built into the primary audio decoder that is utilized by any DVD, DTV, or any other digital audio playback device that is intended to decode and distribute audio signals to the speakers. The downmixing for the non-home theater audio systems provides a method for all users to benefit from a selectable VRA. The adjusted dialog, is distributed to the non-center channel speakers in such a way as to leave the intended spatial positioning of the audio program as intact as possible. However, the dialog level will simply be higher. Further details are discussed next.

There are well-specified guidelines for downmixing 5.1 audio channels (Dolby Digital) to 4 channels (Dolby Pro-Logic), to 2 channels (stereo), or to 1 channel (mono). The proper combinations of the 5.1 channels at the proper ratios were selected to produce the optimum spatial positioning for whichever reproduction system the consumer has. The problem with the existing methods of downmixing is that they are transparent to and not controllable by the end user. This can present problems with intelligibility, given the manner in which dynamic range is utilized in the newer 5.1 channel audio mixes.

Figure 26:
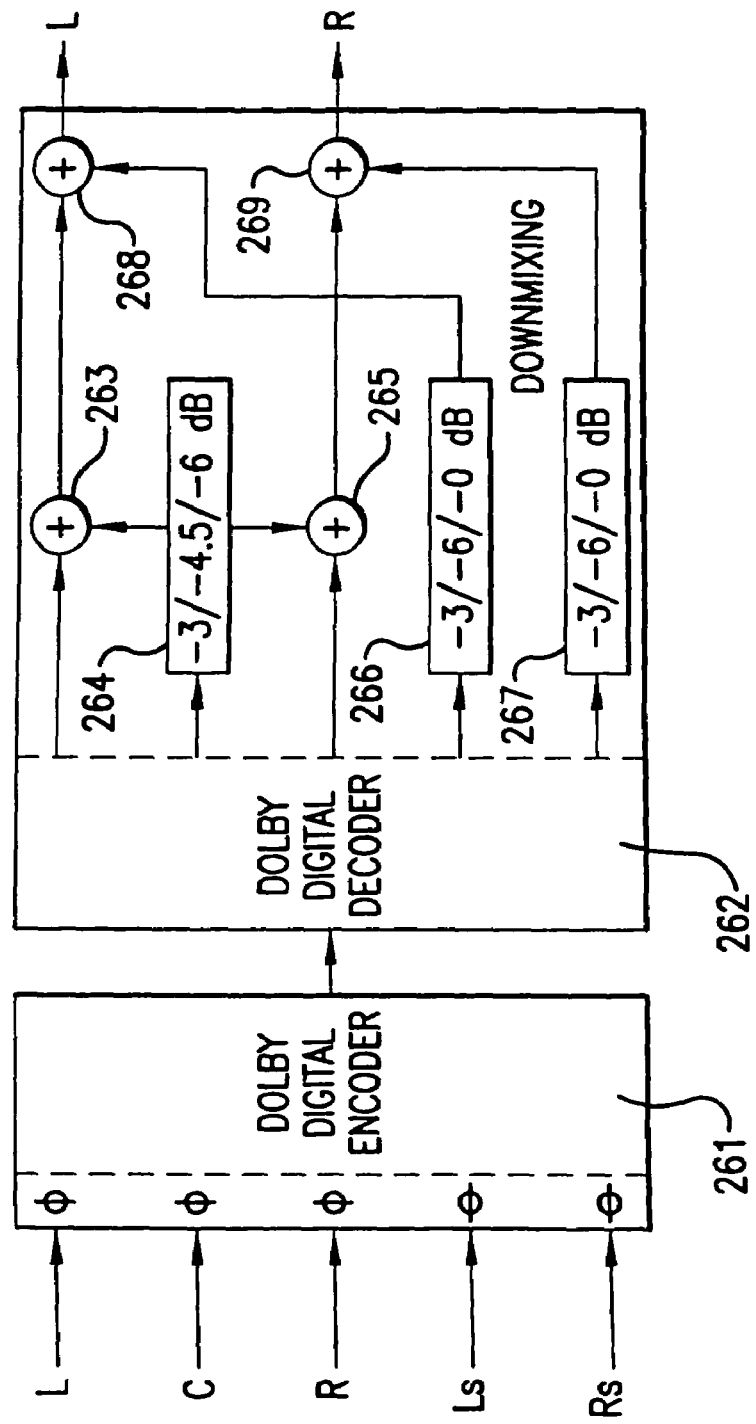
FIG. 26 depicts a Dolby digital prior art encoder and decoder.

As an example, consider a movie that has been produced in 5.1 channels having a segment where the remaining audio masks the dialog making it difficult to understand. If the consumer has 6 speakers and a 6 channel adjustable gain amplifier, speech intelligibility can be improved and maintained as discussed above. However, the consumer that has only stereo reproduction will receive a downmixed version of the 5.1 channels conforming to the diagram shown in FIG. 26 (taken from the Dolby Digital Broadcast Implementation Guidelines). In fact, the center channel level is attenuated by an amount that is specified in the DD bitstream (either −3, −4.5 or −6 dB). This will further reduce intelligibility in segments containing loud remaining audio on the other channels.

This aspect of the present invention circumvents the downmixing process by placing adjustable gain on each of the spatial channels before they are downmixed to the users' reproduction apparatus.

Figure 27:
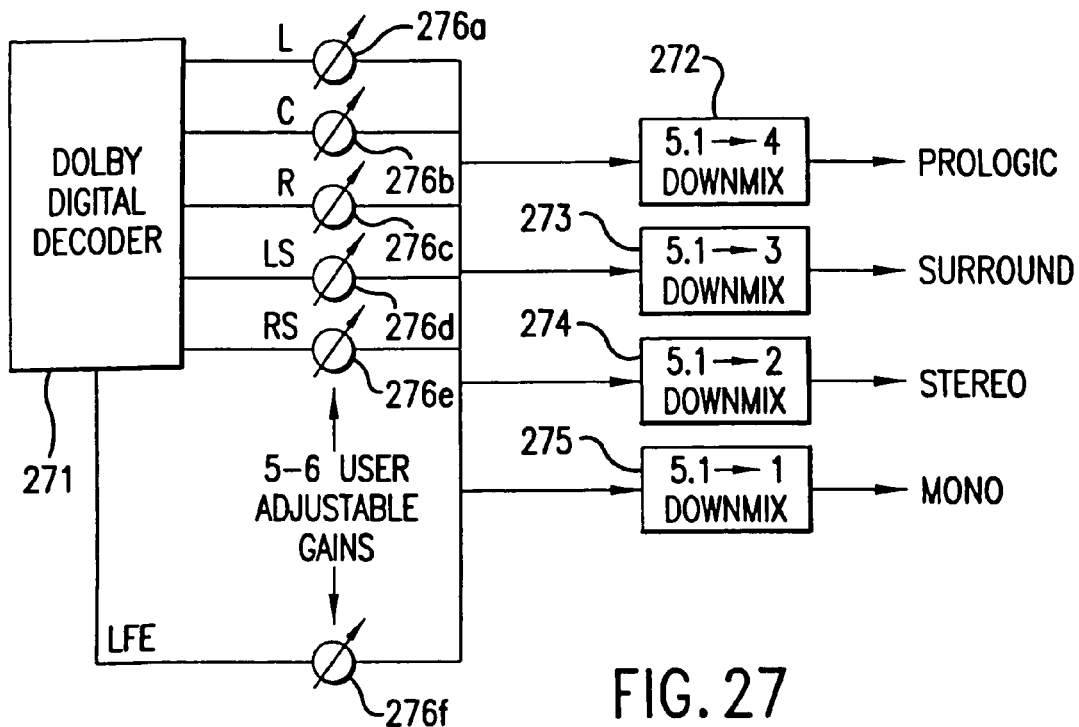
FIG. 27 illustrates the user adjustable levels on each of the decoded 5.1 channels according to the present invention.

FIG. 27 illustrates the user adjustable levels on each of the decoded 5.1 channels. Typically, downmixing of the low frequency effects (LFE) channel is not done to prevent saturation of electronic components and reduced intelligibility. However, with user adjustment available before the dowmnix occurs, it is possible to include the LFE in the downmix in a ratio specified by the user.

Permitting the user to adjust the level of each channel (level adjusters 276*a-g*) allows consumers having any number of reproduction speakers to take advantage of the voice level adjustment previously only available to those people who had 5.1 reproduction channels.

As shown above, this apparatus can be used external to any DD decoder 271 whether it is a standalone decoder, inside a DVD, or inside a television, regardless of the number of reproduction channels are in the home theater system. The user must simply command the decoder 271 to deliver a DD (5.1) output and the "interface box" will perform the adjustment and downmixing, previously performed by the decoder.

Figure 28:
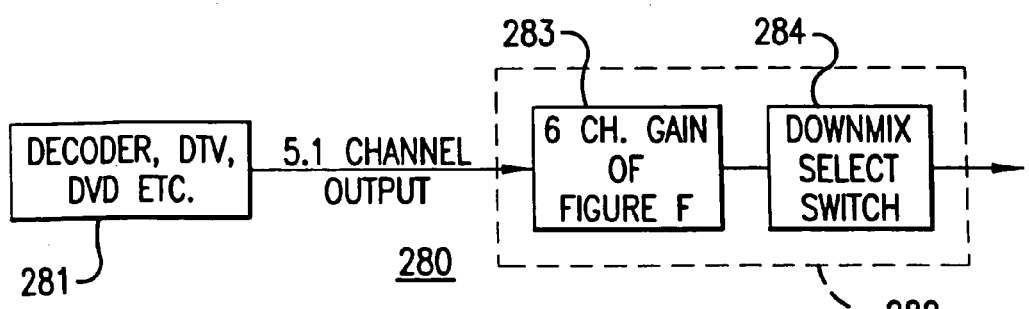
FIG. 28 illustrates the interface box depicted in FIG. 27, according to the present invention.

FIG. 28 illustrates this interface box 282. It can take as its input, the 5.1 decoded audio channels from any DD decoder, apply independent gain to each channel, and downmix according to the number of reproduction speakers the consumer has.

In addition, this aspect of the present invention can be incorporated into any decoder by placing independent user adjustable channel gains on each of the 5.1 channels before any downmixing is performed. The current method is to downmix as necessary and then apply gain. This cannot improve dialog intelligibility because for any downmix situation, the center is mixed into the other channel containing remaining audio.

It should also be noted that the automatic VRA-HOLD mechanisms discussed previously will be very applicable to this embodiment. Once the VRA is selected by adjusting each amplifier gain, the VRA-HOLD feature should maintain that ratio prior to downmixing. Since the ratio is selected while listening to any downmixed reproduction apparatus, the scaling in the downmixing circuits will be compensated for by additional center level adjustment applied by the consumer. So, no additional compensation is necessary as a result of the downmixing process itself.

It should also be noted that bandpass filtering of the center channel before user-adjusted amplification and downmixing will remove sounds lower in frequency than speech and sound higher in frequency than speech (200 Hz to 4000 Hz for example) and may improve intelligibility in some passages. It is also very likely that the content removed for improved intelligibility on the center channel, also exists on the left and right channels since they are intended for reproducing music and effects that would otherwise be outside the speech bandwidth anyway. This will ensure that no loss in fidelity of remaining audio sounds occurs while also improving speech intelligibility.

This aspect of the present invention: 1) allows the consumer having any number of speakers to take advantage of the VRA ratio adjustment presently available to those having 5.1 reproduction speakers; 2) allows those same consumers to set a desired dialog level on the center channel with respect to the remaining audio on the other channels, and have that ratio remain the same for transients through the VRA-HOLD feature; and 3) can be applied to any output of a DD decoder without modifying the bitstream or increasing required transmission bandwidth, i.e., it is hardware independent.

Hearing Impaired Voice Processing

Another aspect of the present invention includes specific processing of voice on digital audio decoders for the benefit of the hearing impaired. Specific filtering or frequency weighting of the audio signal is required. The user-adjustment of the filters from a Graphical User Interface will greatly simplify these adjustments.

Another aspect would be to separately modify the magnitude of the frequency response for both the dialog channel (possibly center or pure dialog depending on the method chosen) and the remaining audio. This would essentially be a graphic equalizer on each channel to achieve maximum adjustability. However, it could also include some fixed shapes for magnitude modification such as high frequency amplification (for hearing impaired) of dialog to improve intelligibility while the high frequencies of the remaining audio would be attenuated.

Other effective processing, including special spatial positioning of the voice for improved intelligibility, may also be possible. For example, dialog may be easier to understand by the hearing impaired if it is presented in a stereo format rather than the more common center channel mono format.

Clearly on screen programming (OSP) will be an option for any of the above ideas since they can all be implemented either as part of the decoder or as a separate box. Knobs, dials, buttons etc. can all be used to accomplish these goals as well.

The manual controls can consist of 1 or two knobs to do the tasks, one for VRA or two for VRA, one for range of VRA deviation or two for range of VRA deviation.

Digital Multi-Channel Decoders

This aspect of the present invention disclosed herein provides the end user of (primarily) digital multi-channel audio decoders, the ability to universally adjust a specified foreground audio signal volume level and spatial location with respect to a specified background audio signal volume level and spatial location.

For a foreground signal including only speech or dialogue programming, this technique will provide the ability to dramatically improve speech intelligibility. This is accomplished by using multiple independent channels to deliver coded audio signals which are, to some degree, specified in terms of audio content. The result is a set of components necessary to provide the end user with this specific adjustment capability while using a pre-specified digital decoder technology.

Additions to and modifications of the digital decoding process are described to provide this end user adjustment capability. Several options are described which will require some modification to the digitally encoded signals, as are options that will require only minimal modification of the encoded signals.

An algorithm is presented for use with a digital decoder that will provide the user with the necessary adjustment capability to adequately alter the speech intelligibility for a wide range of programming content and media delivery methods.

BACKGROUND

Recent advances in digital audio coding technology have initiated wide-ranging changes in the future of audio broadcasting and recording techniques. The Dolby Digital (AC-3) standard has been accepted for use in digital television and is currently (1998) one of the competing audio formats for DVD. AC-3, or a similar multi-channel coding technology will likely be instituted for nearly every aspect of digital audio recording and broadcasting throughout the next decade. Many new features are also included in the AC-3 standard which provide the consumer electronics end user to control aspects of the audio programming that were previously uncontrollable.

The goal of this aspect of the present invention is to provide further features previously unavailable for end user enjoyment, thereby improving upon and expanding features currently employed in existing audio decoder technology.

The actual coding and decoding process has been well documented by Dolby and Toshiba, for the AC-3 encoder/decoder designs. Likewise, other competing multi-channel audio coding formats have been well specified and proven to provide five or more audio channels while conserving signal bandwidth and required storage media. Since these coding technologies are well developed and many have become the standard for audio transmission and storage, it is not the specific goal of these inventions to alter the actual coding and decoding process.

In this and following descriptions "coding" and "decoding" implies the compression and decompression of the bit streams after they have been converted to digital audio. It also includes the process of including other non-audio digital information that informs the decoder about the type of audio-programming and options available.

While one embodiment of this invention seeks to add audio and non-audio information bearing signals to the existing audio coding signals, it will do this while conforming to the coding standards set forth for the particular media. For example, if the inventions are to be applied to digital television (DTV) broadcasting, and the audio standard for DTV broadcasting is AC-3, this aspect of the present invention will conform to the standards set forth in the description of that format. Other embodiments do not require any specific additional information about the coding process itself, in order to implement the inventions.

Therefore, given any multi-channel audio format (notably "digital" but not restricted from analog) the specific user adjustment technology disclosed herein will be implemented in a variety of formats. Information about the technology can be incorporated into the coded bit stream. The user adjustment technology can be accomplished without specific modification of the encoded bit stream. Additionally, the technology can be implemented in any multi-channel digitally coded (or analog) variety of coding schemes, without loss of generality.

Embodiments of the Decoder

The primary thrust of this technology seeks to provide the end user with the ability to universally adjust the audio volume levels of "background" audio with respect to "foreground" audio. Specific implementation for any broadcast or recorded audio may have the foreground audio as a speaker's voice whereas the background audio will be any remaining audio components that are non-voiced such as sound effects in a television show. If the background audio is too loud, it will interfere with the end user's ability to discern speech components. This aspect of the present invention seeks to apply this adjustment capability to digital audio decoders, thereby making the technology easily accessible to a wide range of audio consumers on a variety of media formats.

The following descriptions use the Dolby AC-3 audio coding scheme as an example for a digital implementation of this technology. However, many other audio coding strategies (including DTS, THX, SDDS, linear PCM, MPEG-1, MPEG-2, etc.) exist. The inventions of the digital implementations of this technology are not restricted to AC-3, but can be used in any multi-channel digital audio format. So without loss of generality for use in conjunction with other audio standards, the following are described next using the existing and well-defined AC-3 format.

Annex C of the AC-3 format explains an alternative use of the multi-channel surround audio signals to perform Karaoke using an AC-3 decoder equipped with the ability to decode and recognize the Karaoke encoding scheme. (Karaoke is a means for entertainment whereby music from songs is played without the vocal content so that amateur performers may sing in place of the professional recording artists). The Annex C describes a Karaoke aware decoder that is equipped to handle the incoming Karaoke coded multi-channel content. After the multi-channel signals have been decoded and are formed into separate digital audio signals (called L—left stereo audio, R—right stereo audio, M—"guide melody", V1—"vocal track one", and V2—"vocal track two"), the following algebraic operations occur:

$$L_K = L + a*V1 + b*V2 + c*M$$

$$C_K = d*V1 + e*V2 + f*M$$

$$R_K = R + g*V1 + h*V2 + i*M$$

The resulting signals (called $L_K$, $C_K$, and $R_K$) are the Karaoke output signals corresponding to the left, center and right audio channels, respectively. The coefficients (a, b, c, d, e, f, g, h, i) are used to adjust the level of the signals that they modify. The actual values of these coefficients are left up to specific implementation, and are discussed in Annex C for the Karaoke implementation only. There are several options for alternate inventions regarding this algorithm (set of equations) that will provide the end user with distinctly different end results.

As mentioned earlier, the desired result is to provide the end user (audio consumer) with the ability to improve the speech intelligibility of audio programming by either 1) raising the level of the foreground (desirable or speech) audio components independent of the background (sound effects or other secondary audio programming) audio components OR 2) lowering the background audio components independent of the foreground audio components.

In its current embodiment, the existing algorithm cannot accomplish either of these goals because explicit control is not established over the background audio (L and R), and the foreground audio cannot be raised with respect to the background audio. Other limitations involving the specified content of each of the Karaoke a decoder signals further prevents the end user to have the ability to universally adjust audio programming for the purpose of improving speech intelligibility or listening enhancement by allowing the end user to adjust the relative levels of the voice and remaining audio (hereafter referred to as universal voice-to-remaining-audio (UVRA) adjustment). (Note: "Voice" in general is the desired foreground signal that contains the most information contained in the audio recording or broadcast. However, the term "voice" should not limit the types of signals that may be considered for use as foreground material).

One aspect of the present invention provides UVRA adjustment capability lies in redefining the existing functioning of the AC-3 Karaoke aware decoder. Since other multi-channel codec's may have similar Karaoke style features, these modification can be made to any similar device without departing from this inventions original intent. Using the existing algorithm for creating the output channels from the signals L, R, M, V1, and V2, one can specify specific content of each channel to correspond to certain components of audio programming (broadcast or recording) AND provide unique adjustment capability of the coefficients a, b, c, d, e, f, g, h and i, such that speech intelligibility can be improved by user adjustment of said coefficients.

One possible method for accomplishing this goal is to first have all of these coefficients universally adjustable (essentially from 0 to infinity, where infinity corresponds to the physical limitations of the decoder and audio hardware, such as the D/A).

Second, it should be noted that L and R cannot be adjusted in the original set of equations used to present this first inventive embodiment. This places limitations on what the signal content for each channel can be if the D/A has a fixed output range with no auto-scaling (addressed next). The V1, V2, and M channels are universally adjustable and thus can have any content the provider desires, as long as the voice (foreground) is kept separate from the background. For example, M may contain all of the foreground (desirable, or voice) audio components while the V1 and V2 may contain sound effects, background music, or laughter. For these cases, L and R must either contain no audio signals, or audio that is at a low enough level that the other audio components may be adjusted to levels high enough to obscure the L and R audio so that it is nearly imperceivable. This method allows the end user to adjust a, b, c, d, e, f, g, h and i so that the voice level can be fixed independent of ANY remaining audio programming, and positioned at any of three speaker locations ($L_O$, $R_O$, $C_O$), where the left output, right output and center output are defined by:

$$L_O = L + a*V1 + b*V2 + c*M$$

$$C_O = d*V1 + e*V2 + f*M$$

$$R_O = R + g*V1 + h*V2 + i*M$$

Mentioned earlier was the concept of output scaling (or auto-scaling) and its use in conjunction with unspecified (or specified) content on the decoded (but not output) left and right channels depicted in the above equation and descriptions. Several brief examples presented for the $L_O$ signal only will illustrate the proposed operation of auto-scaling, required for the above procedure to work without specifying content of the L and R channels.

To accomplish the UVRA goal with the above linear combination of decoded signals, the user would need to raise the coefficient on V1 ("a") to a sufficient level above L and/or M in order to achieve the desired VRA ratio. Suppose first that L and M contain identical content that is the entire program (foreground (voice) and (background) remaining audio) in the ratio that the provider intended. Now suppose the V1 channel contains the vocal (dialogue) content synchronized with the original programming. If the user desires to have a 6 dB VRA he/she would select "a" to be 4.0 since the remaining audio is represented twice by L and M:

$$L_O = L + 4.0*V1 + 1.0*M$$

$20*\log_{10}(4.0/2.0)=6$ dB. Now, it is assumed that "full scale" for the D/A hardware is represented by 0 dB. If L, V1, and M are each at full signal scale (0 dB, or 1.0 linear), the linear magnitude of $L_O$ becomes $$L_O 1.0+4.0(1.0)+1.0(1.0)=6, \text{ or } 15.5 \text{ dB}.$$

This level will saturate the D/A since full scale is 0 dB. If UVRA auto-scaling is employed by dividing $L_O$ by its peak magnitude, $L_O$ will be divided by 6.0 resulting in the following expression:

$$L_O=0.1667*L+0.6667*V1+0.1667*M$$

Note that the VRA ratio is still the desired $$6 \text{ dB}=20*\log_{10}(0.6667/(0.1667+0.1667)),$$

but $L_O$=0 dB and will not saturate the D/A. The user has achieved the goal of UVRA adjustment. However, it is critical to note that this example was prepared for a certain method of auto-scaling and a certain content of each of the previously decoded signals.

One more example that will further generalize the possible content of each of the channels is now presented. Suppose L and M do not contain similar content and cannot be played simultaneously. (A more generalized scenario that relaxes the assumptions on the signal contents). However, the V1 channel still contains only the programming dialogue or foreground and the M channel is still the remaining audio or background. Therefore, a user adjusted mix of only M and V1 would result in the desired UVRA adjustment capability. Even though there is no explicit adjustment of the remaining "L" signal provided by the algorithm shown above we can effectively change the coefficient by an innovative use of the auto-scaling process. (Note: this example can be generalized to be used with ANY two signals as long as one of them has a volume controller and auto-scaling works as described herein).

In order to accomplish the HEC goal with the signals described above, two things need to occur:

Raise the voice to a desired level (say 6 dB) over the remaining audio.

Raise the combined voice (V1) and remaining audio (M) to a higher level than the L signal which has no adjustment capability, and a fixed coefficient of 1.0.

First, in order for the remaining audio on the "M" channel to sufficiently obscure the left channel audio "L", let's suppose the level of the M channel must exceed the L channel by 20 dB. (It may be more or less depending on the type of programming on each channel). Therefore the coefficient of the M channel ("c") must be 10.0 since the coefficient of the "L" channel is 1.0 ($20*\log_{10}(10.0/1.0)=20$ dB). Now for the voice signal to be 6 dB greater than the remaining audio, the coefficient "a" must be 22.0 because $20*\log_{10}(22.0/11.0)=6.0$ dB, where 11.0 is the sum of the M channel and the L channel power. The overall equation then becomes $$L_O=L+22.0*V1+10.0*M$$

Since full scale was set at 1.0 for $L_O$, it is clear that the above summation must be scaled as before to avoid D/A saturation. The result of scaling of $L_O$ by 33.0 is:

$$L_O=0.0303*L+0.6667*V1+0.4545*M$$

Note that the summation of all signals is unity (0 dB), the VRA is 6 dB, and the VRA ratio of the foreground plus background content (M+V1) to the unknown content (L) is 20 dB. This explains how the specified method of auto-scaling can be used to allow the original set of algebraic relations to result in UVRA adjustment without explicit control over the coefficient of L. This establishes the ability to provide end user UVRA adjustment without affecting the standardized method for linear combinations. The additional innovative components include channel content specification, universal parameter adjustment and output signal auto-scaling.

The next embodiment involves the development of an entirely new algorithm that can be used in conjunction with multi-channel audio coder's to deliver UVRA adjustment capability to the end user, while still retaining much of the imaging capabilities inherent in such codec's. The primary goal is to have the programming provider (recorder, broadcast, or otherwise), deliver a voice only signal of any type of audio programming on one or more of these available multiple channels while simultaneously but independently delivering the remaining audio components on the other channels.

Some standardization needs to be agreed upon if the UVRA adjustment capability is to be constructed into a variety of decoders and mediums. The following algorithm seeks to provide that standard, or some form of such a standard. As will be seen, it matters little as to which channel(s) the voice is actually transmitted on, since all components are adjustable. (This provides an interesting feature to such a decoding scheme in that the UVRA capability can be ignored without disturbing the normal programming). The goal of multi-channel audio is to provide the end user with a surrounding sound that makes audio programming seem more lifelike. It is desirable to provide the end user with the ability to adjust the VRA without significantly interfering with the sound quality. One possible way that this can be accomplished is by using the following algorithm:

$$L_O=a*L+b*C$$

$$C_O=c*L+d*R+e*C$$

$$R_O=f*R+g*C$$

$$L_{SO}=h*L_S+i*C$$

$$R_{SO}=j*R_S+k*C$$

The decoded audio signals are specified by L, R, C, $L_S$, and $R_S$. The total output signals of the decoder (subscripted by "O"), are algebraic functions of the decoded audio signals. The manner in which the above algorithm has been developed provides maximum adjustability, UVRA adjustment for location and level, and minimal interference in the surround image that is normally created for regular multi-channel audio programming.

In this embodiment, the audio signal C must be taken to be the foreground audio. Assuming the foreground audio is considered to be voice or speech, the user can adjust the level and location of the voice by changing b, e, g, i, and/or k with respect to the other user adjustable coefficients. The left audio output will contain the left signal, the right audio output will contain the right signal, and same with subsequent surround signals and outputs.

The primary difference here is that the center audio output is now a combination of the original left, right, and foreground signals. In practice it is not uncommon to have the center channel consist of primarily left and right components, sounds that do not require any type of imaging.

It is inevitable that some spatiality ability be lost in this design because one of the 5 original audio channels must be occupied by pure foreground in order for the user to have control over the relative levels. It is also important to note that for ideal performance of the UVRA system, L, R, $L_S$, and $R_S$ should contain only background audio components. This will allow the user to adjust the levels with respect to each other completely independently. However, it is possible for these signals to contain components of the foreground signal as long as they are properly synchronized with the foreground audio (on the center channel in this description) to avoid echoes and/or spectral cancellation.

Other forms of these equations are possible by redefining the specific content of each of the original decoded audio signals, that will ultimately accomplish the identical goal of UVRA and spatial positioning of background and foreground audio independent, or nearly independent of each other. As long as adjustment capabilities are provided on the foreground signal with respect to and independent of the background signal, the goal of UVRA adjustment (both volume and spatial positioning) will be accomplished and the intent of this invention will be realized.

It should be clear that the above procedure can be carried out without any specific modification to the decoder itself. If the linear combination of the decoder signals is carried out within the decoder hardware, it is obvious that modifications must also occur to those particular algorithms.

However, it is not necessary if the program provider supplies the encoder with the signals as mentioned above, and the decoder provides the end user with the raw decoded audio signals prior to linear combination. In this embodiment, a second piece of hardware can be used to perform the linear combination of these signals (which can be analog or digital) and provide the end user with the specified adjustment capability.

Alternately, modification of the digitally encoded bit stream may also be performed to inform the decoder that a special "UVRA organized" signal is (optionally) available. This may permit decoder to provide the end user with a choice between normal multi-channel audio programming and a special UVRA adjustable multi-channel signal. If the user selects the UVRA audio stream instead of the normal audio stream, the adjustment capabilities can be performed either on an external unit or internally to the decoder itself prior to the D/A operation.

Other information can also be added to the bit stream by the program provider informing the end user of the channel that the foreground audio is on, the desired spatial arrangement, and suggested coefficients for proper positioning or placement of the foreground and background audio signals.

To summarize, this aspect of the present invention relies on the ability to deliver the foreground audio separately from the background audio. Many multi-channel audio formats delivery of such signals although they do not specify content of each signal beyond the spatiality. With this aspect of the present invention, for some sacrifice in spatiality, the end user can receive the ability to universally adjust the foreground audio with respect to the background audio providing at least one obvious result that speech intelligibility can be improved for the case where foreground audio is voice and background audio is an (otherwise) noisy signal that may frequently obscure the voice.

This aspect of the present invention can be provided in a variety of audio codec formats in manners that may also involve limited (including special scaling abilities) and/or unlimited adjustment of channel coefficients, specified and/or loosely specified content descriptions of channels, modifying the decoder bit stream and/or not modifying the bit stream (with cooperation from audio programming providers), and providing alternate but useful information concerning the use of the UVRA signal grouping or receiving normal multi-channel audio programming.

While many changes and modifications can be made to the invention within the scope of the appended claims, such changes and modifications are within the scope of the claims and covered thereby.

What is claimed is:

1. An audio system for optimizing playing of an audio program, which includes a preferred audio signal and a remaining audio signal, for end users, which includes both hearing impaired and non-hearing impaired listeners, comprising:

a) a first end user adjustable amplifier for receiving the preferred audio signal and a first gain selected by an end user, and for amplifying the preferred audio signal to a level corresponding to the first gain specified by the user, said first end user adjustable amplifier having a range of amplification from zero to a maximum value, and said first end user adjustable amplifier having as a control output a gain selection value representing a numerical value of the first gain selected by the end user of the first end user adjustable amplifier;

b) a second end user adjustable amplifier for receiving the remaining audio signal and a second gain selected by the end user, and for amplifying the remaining audio signal to a level corresponding to the second gain specified by the user, said second end user adjustable amplifier having a range of amplification from zero to a maximum value, and said second end user adjustable amplifier having as a control output a gain selection value representing a numerical value of the second gain selected by the end user of the second end user adjustable amplifier; and c) a corrector circuit for receiving as a first input the control output of the first end user adjustable amplifier, for receiving as a second input the control output of the second end user adjustable amplifier, for calculating a desired preferred audio signal to remaining audio signal ratio based on the first input and the second input, for receiving as a third input the output of the first end user adjustable amplifier, for receiving as a fourth input the output of the second end user adjustable amplifier, and for modifying the output of the first end user adjustable amplifier and the output of the second end user adjustable amplifier so that the actual preferred audio signal to remaining audio signal (PSRA) ratio corresponds to the calculated desired value of the preferred audio signal to remaining audio signal (PSRA) ratio.

2. The system according to claim 1, wherein the corrector circuit comprises:

a) a first divider for receiving as a numerator input the control output of the first end user adjustable amplifier, for receiving as a denominator input the control output of the second end user adjustable amplifier, and for outputting the result of the numerator input divided by the denominator input, which represents the end user desired preferred audio signal to remaining audio signal (PSRA) ratio;

b) a first vector accumulator coupled to the output of the first end user adjustable amplifier, for storing vector samples of the preferred audio signal;

c) a second vector accumulator coupled to the output of the second end user adjustable amplifier for storing vector samples of the remaining audio signal;

d) a first peak level detector coupled to the output of the first vector accumulator, wherein the first peak detector for calculating a transient amplitude of a segment of the preferred audio signal represented by the vector samples in the first vector accumulator;

e) a second peak level detector coupled to the output of the second vector accumulator, wherein the first peak detector for calculating a transient amplitude of a segment of the remaining audio signal represented by the vector samples in the second vector accumulator;

f) a second divider for receiving as a numerator input the output of the first peak level detector representing the transient amplitude of the segment of the preferred audio signal represented by the vector samples in the first vector accumulator, for receiving as a denominator input the output of the second peak detector representing the transient amplitude of the segment of the remaining audio signal represented by the vector samples in the second vector accumulator, and for outputting the result of the numerator input divided by the denominator input representing an actual value of the preferred audio signal to the remaining audio signal (PSRA) ratio;

g) a third divider for receiving as a numerator input the output of the first divider representing a desired value of the preferred audio signal to the remaining audio signal (PSRA) ratio, for receiving as a denominator input the output of the second divider representing an actual value of the preferred audio signal to the remaining audio signal (PSRA) ratio, and for outputting the result of the numerator input divided by the denominator input, which represents a difference between the desired and actual values of the preferred audio signal to the remaining audio signal (PSRA) ratio; and h) a first multiplier for receiving as a first input the preferred audio signal, for receiving as a second input the output of the third divider, and for multiplying the output of the third divider and the preferred audio signal and for outputting the result, which is a corrected value of the user setting of the preferred audio signal to the remaining audio signal (PSRA) ratio.

3. The system according to claim 2, wherein the first and second vector accumulators include user selectable vector sizes.

4. The system according to claim 1, wherein the corrector circuit comprises:

a) a first divider for receiving as a numerator input the control output of the first end user adjustable amplifier, for receiving as a denominator input the control output of the second end user adjustable amplifier, and for outputting the result of the numerator input divided by the denominator input, which represents the end user desired preferred audio signal to remaining audio signal (PSRA) ratio;

b) a first vector accumulator coupled to the output of the first end user adjustable amplifier, for storing vector samples of the preferred audio signal;

c) a second vector accumulator coupled to the output of the second end user adjustable amplifier for storing vector samples of the remaining audio signal;

d) a first peak level detector coupled to the output of the first vector accumulator, wherein the first peak detector for calculating a transient amplitude of a segment of the preferred audio signal represented by the vector samples in the first vector accumulator;

e) a second peak level detector coupled to the output of the second vector accumulator, wherein the first peak detector for calculating a transient amplitude of a segment of the remaining audio signal represented by the vector samples in the second vector accumulator;

f) a second divider for receiving as a numerator input the output of the first peak level detector representing the transient amplitude of the segment of the preferred audio signal represented by the vector samples in the first vector accumulator, for receiving as a denominator input the output of the second peak detector representing the transient amplitude of the segment of the remaining audio signal represented by the vector samples in the second vector accumulator, and outputting the result of the numerator input divided by the denominator input representing an actual value of the preferred audio signal to the remaining audio signal (PSRA) ratio;

g) a third divider for receiving as a numerator input the output of the first divider representing a desired value of the preferred audio signal to the remaining audio signal (PSRA) ratio, for receiving as a denominator input the output of the second divider representing an actual value of the preferred audio signal to the remaining audio signal (PSRA) ratio, and for outputting the result of the numerator input divided by the denominator input, which represents a difference between the desired and actual values of the preferred audio signal to the remaining audio signal (PSRA) ratio;

h) a fourth divider having as a denominator input the output of the third divider, and for dividing one by the output of the third divider; and i) a multiplier for receiving as a first input the remaining audio signal, for receiving as a second input the output of the fourth divider and for multiplying the output of the fourth divider and the remaining audio signal and for outputting the result, which is the corrected value of the user setting of the preferred audio signal to the remaining audio signal (PSRA) ratio.

5. An audio system for optimizing playing of an audio program, which includes a preferred audio signal and a remaining audio signal, for end users, which includes both hearing impaired and non-hearing impaired listeners, comprising:

a) a plurality of user selectable frequency dependent amplification devices, each device for establishing a preferred audio signal to remaining audio (PSRA) over a separate frequency band, and each of the plurality of user selectable frequency dependent amplification devices including:

(i) a first bandpass filter for receiving the preferred audio signal and for filtering out everything within the preferred audio signal except for a predetermined bandwidth of the preferred audio signal;

(ii) a second bandpass filter for receiving the remaining audio signal and for filtering out everything within the remaining audio signal except for a predetermined bandwidth of the remaining audio signal;

(iii) a first end user adjustable amplifier for receiving the predetermined bandwidth of the preferred audio signal and a first gain selected by an end user, and for amplifying the predetermined bandwidth of the preferred audio signal to a level corresponding to the first gain specified by the user, said first end user adjustable amplifier having a range of amplification from zero to a maximum value, and said first end user adjustable amplifier having as a control output a gain selection value representing a numerical value of the first gain selected by the end user of the first end user adjustable amplifier;

(iv) a second end user adjustable amplifier for receiving the predetermined bandwidth of the remaining audio signal and a second gain selected by the end user, and for amplifying the predetermined bandwidth of the remaining audio signal to a level corresponding to the second gain specified by the user, said second end user adjustable amplifier having a range of amplification from zero to a maximum value, and said second end user adjustable amplifier having as a control output a gain selection value representing a numerical value of the second gain selected by the end user of the second end user adjustable amplifier; and (v) a corrector circuit for receiving as a first input the control output of the first end user adjustable amplifier, for receiving as a second input the control output of the second end user adjustable amplifier, for calculating a desired preferred audio signal to remaining audio signal ratio based on the first input and the second input, for receiving as a third input the output of the first end user adjustable amplifier, for receiving as a fourth input the output of the second end user adjustable amplifier, and for modifying the output of the first end user adjustable amplifier and the output of the second end user adjustable amplifier so that the actual preferred audio signal to remaining audio signal (PSRA) ratio for the predetermined bandwidth corresponds to the calculated desired value of the preferred audio signal to remaining audio signal (PSRA) ratio for the predetermined bandwidth; and b) a summing amplifier for receiving the outputs of all of the plurality of user selectable frequency dependent amplification devices to create a total audio signal.

6. The system according to claim 5, wherein each of the corrector circuits comprises:
   a) a first divider for receiving as a numerator input the control output of the first end user adjustable amplifier, for receiving as a denominator input the control output of the second end user adjustable amplifier, and for outputting the result of the numerator input divided by the denominator input, which represents the end user desired preferred audio signal to remaining audio signal (PSRA) ratio;
   b) a first vector accumulator coupled to the output of the first end user adjustable amplifier, for storing vector samples of the preferred audio signal;
   c) a second vector accumulator coupled to the output of the second end user adjustable amplifier for storing vector samples of the remaining audio signal;
   d) a first peak level detector coupled to the output of the first vector accumulator, wherein the first peak detector for calculating a transient amplitude of a segment of the preferred audio signal represented by the vector samples in the first vector accumulator;
   e) a second peak level detector coupled to the output of the second vector accumulator, wherein the first peak detector for calculating a transient amplitude of a segment of the remaining audio signal represented by the vector samples in the second vector accumulator;
   f) a second divider for receiving as a numerator input the output of the first peak level detector representing the transient amplitude of the segment of the preferred audio signal represented by the vector samples in the first vector accumulator, for receiving as a denominator input the output of the second peak detector representing the transient amplitude of the segment of the remaining audio signal represented by the vector samples in the second vector accumulator, and for outputting the result of the numerator input divided by the denominator input representing an actual value of the preferred audio signal to the remaining audio signal (PSRA) ratio;
   g) a third divider for receiving as a numerator input the output of the first divider representing a desired value of the preferred audio signal to the remaining audio signal (PSRA) ratio, for receiving as a denominator input the output of the second divider representing an actual value of the preferred audio signal to the remaining audio signal (PSRA) ratio, and for outputting the result of the numerator input divided by the denominator input, which represents a difference between the desired and actual values of the preferred audio signal to the remaining audio signal (PSRA) ratio; and
   h) a first multiplier for receiving as a first input the preferred audio signal, for receiving as a second input the output of the third divider, and for multiplying the output of the third divider and the preferred audio signal and for outputting the result, which is a corrected value of the user setting of the preferred audio signal to the remaining audio signal (PSRA) ratio.

7. The system according to claim 5, wherein each of the corrector circuits comprises:
   a) a first divider for receiving as a numerator input the control output of the first end user adjustable amplifier, for receiving as a denominator input the control output of the second end user adjustable amplifier, and for outputting the result of the numerator input divided by the denominator input, which represents the end user desired preferred audio signal to remaining audio signal (PSRA) ratio;
   b) a first vector accumulator coupled to the output of the first end user adjustable amplifier, for storing vector samples of the preferred audio signal;
   c) a second vector accumulator coupled to the output of the second end user adjustable amplifier for storing vector samples of the remaining audio signal;
   d) a first peak level detector coupled to the output of the first vector accumulator, wherein the first peak detector for calculating a transient amplitude of a segment of the preferred audio signal represented by the vector samples in the first vector accumulator;
   e) a second peak level detector coupled to the output of the second vector accumulator, wherein the first peak detector for calculating a transient amplitude of a segment of the remaining audio signal represented by the vector samples in the second vector accumulator;
   f) a second divider for receiving as a numerator input the output of the first peak level detector representing the transient amplitude of the segment of the preferred audio signal represented by the vector samples in the first vector accumulator, for receiving as a denominator input the output of the second peak detector representing the transient amplitude of the segment of the remaining audio signal represented by the vector samples in the second vector accumulator, and for outputting the result of the numerator input divided by the denominator input representing an actual value of the preferred audio signal to the remaining audio signal (PSRA) ratio;
   g) a third divider for receiving as a numerator input the output of the first divider representing a desired value of the preferred audio signal to the remaining audio signal (PSRA) ratio, for receiving as a denominator input the output of the second divider representing an actual value of the preferred audio signal to the remaining audio signal (PSRA) ratio, and for outputting the result of the numerator input divided by the denominator input, which represents a difference between the desired and actual values of the preferred audio signal to the remaining audio signal (PSRA) ratio;
   h) a fourth divider having as a denominator input the output of the third divider, and for dividing one by the output of the third divider; and i) a multiplier for receiving as a first input the remaining audio signal, for receiving as a second input the output of the fourth divider and for multiplying the output of the fourth divider and the remaining audio signal and for outputting the result, which is the corrected value of the user setting of the preferred audio signal to the remaining audio signal (PSRA) ratio.

8. A method for optimizing playing of an audio program for end users including both hearing impaired and non-hearing impaired listeners, which includes a preferred audio signal and a remaining audio signal, comprising:
   a) receiving the preferred audio signal and a first gain selected by an end user, and amplifying the preferred audio signal to a level corresponding to the first gain specified by the user using a first end user adjustable amplifier having a range of amplification from zero to a maximum value, and said first end user adjustable amplifier having as a control output a gain selection value representing a numerical value of the first gain selected by the end user of the first end user adjustable amplifier;
   b) receiving the remaining audio signal and a second gain selected by the end user, and amplifying the remaining audio signal to a level corresponding to the second gain specified by the user using a second end user adjustable amplifier having a range of amplification from zero to a maximum value, and said second end user adjustable amplifier having as a control output a gain selection value representing a numerical value of the second gain selected by the end user of the second end user adjustable amplifier; and
   c) receiving as a first input the control output of the first end user adjustable amplifier using a corrector circuit, receiving as a second input the control output of the second end user adjustable amplifier, calculating a desired preferred audio signal to remaining audio signal ratio based on the first input and the second input, receiving as a third input the output of the first end user adjustable amplifier, receiving as a fourth input the output of the second end user adjustable amplifier, and modifying the output of the first end user adjustable amplifier and the output of the second end user adjustable amplifier so that the actual preferred audio signal to remaining audio signal (PSRA) ratio corresponds to the calculated desired value of the preferred audio signal to remaining audio signal (PSRA) ratio.

9. The method according to claim 8, wherein the corrector circuit performs:
   a) receiving as a numerator input the control output of the first end user adjustable amplifier, receiving as a denominator input the control output of the second end user adjustable amplifier, and outputting the result of the numerator input divided by the denominator input, which represents the end user desired preferred audio signal to remaining audio signal (PSRA) ratio;
   b) storing vector samples of the preferred audio signal;
   c) storing vector samples of the remaining audio signal;
   d) calculating a transient amplitude of a segment of the preferred audio signal represented by the vector samples of the preferred audio signal;
   e) calculating a transient amplitude of a segment of the remaining audio signal represented by the vector samples of the remaining audio signal;
   f) receiving as a numerator input the transient amplitude of the segment of the preferred audio signal, receiving as a denominator input the transient amplitude of the segment of the remaining audio signal, and outputting the result of the numerator input divided by the denominator input representing an actual value of the preferred audio signal to the remaining audio signal (PSRA) ratio;
   g) receiving as a numerator input a desired value of the preferred audio signal to the remaining audio signal (PSRA) ratio, receiving as a denominator input an actual value of the preferred audio signal to the remaining audio signal (PSRA) ratio, and outputting the result of the numerator input divided by the denominator input, which represents a difference between the desired and actual values of the preferred audio signal to the remaining audio signal (PSRA) ratio; and
   h) receiving as a first input the preferred audio signal, receiving as a second input the output of the third divider, and multiplying the difference between the desired and actual values of the preferred audio signal to the remaining audio signal (PSRA) ratio and the preferred audio signal and for outputting the result, which is a corrected value of the user setting of the preferred audio signal to the remaining audio signal (PSRA) ratio.

10. The method according to claim 9, wherein the size of the vector samples are user selectable.

* * * * *